(12) United States Patent
Tang

(10) Patent No.: US 11,901,905 B2
(45) Date of Patent: Feb. 13, 2024

(54) RECEIVER SIDE SETUP AND HOLD CALIBRATION

(71) Applicant: SanDisk Technologies LLC, Addison, TX (US)

(72) Inventor: Tianyu Tang, Milpitas, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 79 days.

(21) Appl. No.: 17/667,451

(22) Filed: Feb. 8, 2022

(65) Prior Publication Data

US 2023/0253969 A1    Aug. 10, 2023

(51) Int. Cl.
*G11C 7/22* (2006.01)
*H03L 7/081* (2006.01)
*G06F 13/42* (2006.01)
*G06F 13/40* (2006.01)

(52) U.S. Cl.
CPC ........ *H03L 7/0814* (2013.01); *G06F 13/4022* (2013.01); *G06F 13/4221* (2013.01); *G11C 7/222* (2013.01)

(58) Field of Classification Search
CPC .......... G11C 7/00; G11C 7/10; G11C 7/1051; G11C 7/1078; G11C 7/22; G11C 7/222; G06F 1/10; G06F 13/1668; H03L 7/0814; H03K 5/13; H03K 5/131; H03K 5/133
USPC .................................. 375/355, 376
See application file for complete search history.

(56) References Cited

U.S. PATENT DOCUMENTS 10,530,347 B2 * 1/2020 Tang .................... G11C 7/1093
11,081,193 B1 * 8/2021 Tang .................... G11C 16/32

* cited by examiner

*Primary Examiner* — Hai L Nguyen
(74) *Attorney, Agent, or Firm* — Hector A. Agdeppa; SHEPPARD, MULLIN, RICHTER & HAMPTON LLP

(57) ABSTRACT

The present disclosure provides for calibrating clock signals in an unmatched data input system. In various embodiments, an unmatched data input system uses multi-delay circuits to calibrate a clock signal distributed to various input/outputs in the unmatched data input system. These multi-delay circuits can include coarse delay circuits and fine delay circuits that provide a broad range as well as accurate delay capabilities. Through the use of these multi-delay circuits, the unmatched data input system can optimally align a clock signal with its associated data signal across multiple input/outputs.

20 Claims, 16 Drawing Sheets

RECEIVER SIDE SETUP AND HOLD CALIBRATION

BACKGROUND

In various systems involving the transfer and storage of data, a sending circuit may send a data signal and a dock signal to a receiving circuit. The data signal may carry data that may be stored by the receiving circuit. The dock signal may provide a repetitive signal that allows the sending circuit and the receiving circuit to coordinate their actions. For example, the receiving circuit may identify data values in the data signal based on transitions in the dock signal. As technologies related to the transfer and storage of data continue to develop, the various systems involving the transfer and storage of data utilizing increasingly faster dock signals, which leads to technological problems. For example, with faster dock signals, small deviations between the data signal and the dock signal can result in errors when transferring and storing data. Thus, technologies for the transfer and storage of data continue to face technological problems.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

With continued advances in technologies related to the transfer and storage of data, so too do technological problems arise in these technologies. For example, various memory systems rely on a clock signal to coordinate the transfer and storage of data in an associated data signal. With continued advances to these memory systems, the need to align clock signals more precisely with their associated data signals remains a source of technological problems these memory systems face. Accordingly, the present disclosure provides for calibrating clock signals in an unmatched data input system. In various embodiments, an unmatched data input system uses multi-delay circuits to calibrate a clock signal distributed to various input/outputs in the unmatched data input system. These multi-delay circuits can include coarse delay circuits and fine delay circuits that provide a broad range as well as accurate delay capabilities. Through the use of these multi-delay circuits, the unmatched data input system can optimally align a clock signal with its associated data signal across multiple input/outputs. Thus, the present disclosure provides for improvements to various technologies related to the transfer and storage of data.

Figure 1:
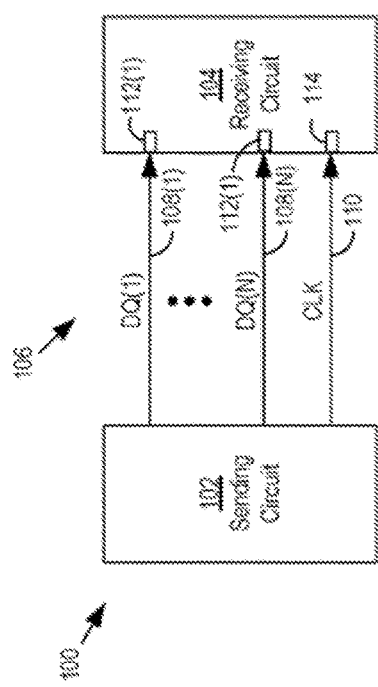
FIG. 1 is a block diagram of an example system that includes a sending circuit and a receiving circuit.

FIG. 1 shows one embodiment of a system 100 in which one or more data/clock alignment circuits may be implemented. The system 100 includes a sending circuit 102 and a receiving circuit 104 configured to communicate with each other via a communications bus 106. Both the sending circuit 102 and the receiver circuit 104 may be transceiver circuits, which can be configured to transmit and receive signals. For simplicity, with reference to FIG. 1, one of the circuits 102 is designated as the sending circuit 102 and the other circuit 104 is designated as the receiving circuit 104.

Additionally, in particular example configurations, each of the sending circuit 102 and the receiving circuit 104 are integrated circuits (IC). In general, an integrated circuit (IC)—also referred to as a monolithic IC, a chip, or a microchip—is an assembly or a collection of electric circuit components (including active components, such as transistors and diodes, and passive components, such as capacitors and resistors) and their interconnections formed as a single unit, such as by being fabricated, on a substrate typically made of a semiconductor material such as silicon. For such embodiments, the sending circuit 102 and the receiving circuit 104 are separate integrated circuits, and the communication bus 106 is configured to communicate signals external to the separate sending circuit (IC) 102 and the receiving circuit (IC) 104.

The sending circuit 102 is configured to send a clock signal CLK and a plurality of data signals DQ to the receiving circuit 104 via a communications bus 106. Otherwise stated, the receiving circuit 104 is configured to receive a clock signal CLK and a plurality data signals DQ from the sending circuit 102 via the communications bus 106. The plurality of data signals DQ are shown in FIG. 1 as including data signals DQ(1) to DQ(N), where N is two or more. For particular example configurations, N is 8, although other integer numbers of two or more may be possible for other example configurations.

From the perspective of the sending circuit 102, the clock signal CLK is an output clock signal, and the data signals DQ are output data signals in that they are the clock and data signals that the sending circuit 102 outputs to the receiving circuit 104. From the perspective of the receiving circuit 104, the clock signal CLK is an input clock signal, and the data signals DQ are input data signals in that they are the clock and data signals that the receiving circuit 104 receives from the sending circuit 102.

The communications bus 106 includes data lines 108(1) to 108(N) between the sending circuit 102 and the clock circuit 104. The receiving circuit has data input contacts 112(1) to 112(N), which are in physical and electrical contact with the respective data lines 108(1) to 108(N). The data input contacts 112(1) to 112(N) could be pins, pads, etc. The sending circuit 102 is configured to send the data signals DQ(1) to DQ(N) simultaneously and/or in parallel over the data lines 108(1) to 108(N) to the receiving circuit 104. Otherwise stated, the receiving circuit 104 is configured to receive the data signals DQ(1) to DQ(N) simultaneously and/or in parallel from over the data lines 108(1) to 108(N).

In addition, the communications bus 106 includes one or more clock lines 110 between the sending circuit 102 and the receiving circuit 104. The receiving circuit has one or more clock input contacts 114, which is/are in physical and electrical contact with the respective one or more clock lines 110. The clock input contact(s) could be pins, pads, etc. As described in further detail below, the input clock signal CLK may include a single-ended clock signal or a pair of complementary clock signals (e.g., CLK and CLKB). Where the input clock signal CLK is a single-ended clock signal, the one or more clock lines 110 may include a single clock line. Where the input clock signal CLK is a pair of complementary clock signals CLK, CLKB, the one or more clock lines 110 may include two clock lines. The sending circuit 102 may be configured to transmit each clock signal CLK, CLKB of the complementary pair over a respective one of the two clock lines 110. The receiving circuit 104 is configured to receive the input clock signal CLK—either as a single-ended clock signal or as a pair of complementary clock signals—simultaneously and/or in parallel with the input of data signals DQ(1) to DQ(N).

The sending circuit 102 and the receiving circuit 104 form a source synchronous system 100. A source synchronous system is a system in which a source circuit sends a data signal along with a clock signal to a destination circuit in order for the destination circuit to use the clock signal to identify the data values of the data signal. In the system 100, the sending circuit 102 is the source circuit, and the receiving circuit 104 is the destination circuit. However, as transceiver circuits, the sending circuit 102 and the receiving circuit 104 may change roles. For example, in certain operations, circuit 104 sends a clock signal and a data signal to circuit 102, and circuit 102 uses the clock signal to identify the data values of the data signal. For such operations, the circuit 104 becomes the sending or the source circuit, and the circuit 102 becomes the receiving or the destination circuit.

In general, a signal, such as the input clock signal CLK and the input data signals DQ may be at a level at a given point in time. As used herein, a level of a signal is a magnitude value, such as a voltage magnitude value or a current magnitude value. In some cases, the signal may be referred to as being at a high level or at a low level, transitioning between a high level and a low level, or transitioning between a low level and a high level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

Figure 2A:
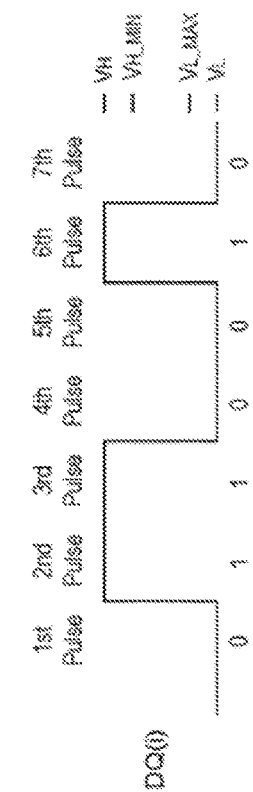
FIG. 2A is an example timing diagram of a data signal.
Figure 2B:
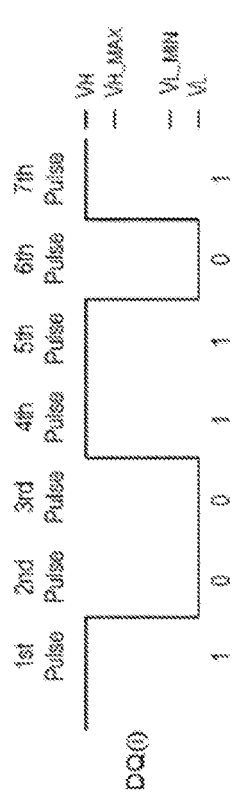
FIG. 2B is an example timing diagram of an inverted version of the data signal of FIG. 2A.

With reference to FIGS. 2A and 2B, a high level of a signal is a level that is at or above a minimum high level $V_{H\_MIN}$, and a low level of the signal is a level that is at or below a maximum low level $V_{L\_MAX}$. The minimum high level $V_{H\_MIN}$ and the maximum low level $V_{L\_MAX}$ may be predetermined levels or values, and in particular example configurations, predetermined levels or values specified as part of a swing requirement with which the source circuit 102 is configured to comply when transmitting the signal. A signal that transitions according to and/or in compliance with the swing requirement transitions to a high level that is at or above the minimum high level $V_{H\_MIN}$ of the swing requirement, and transitions to a low level that is at or below the maximum low level $V_{L\_MAX}$ of the swing requirement.

In general, a signal performs transitions between its high level and its low level. A given transition of a signal may be one of two transition types, including a rising transition and a falling transition. A signal performs a rising transition when the signal transitions from its low level to its high level, and performs a falling transition when the signal transitions from its high level to its low level.

A portion of a magnitude waveform of a signal over a transition is referred to as an edge. In particular, a portion of the magnitude waveform over a rising transition is a rising edge and a portion of the magnitude waveform over a falling transition is a falling edge.

Also, a clock signal, such as the input clock signal CLK, is a signal that has repetitive cycles occurring over successive periods T. Within a cycle, one of the portions is at a high level and the other portion is at a low level. Accordingly, the portions may be defined by consecutive rising and falling transitions or edges of the clock signal. For example, a given rising edge or a given falling edge may define or mark a boundary when one portion ends and a next portion, either of the same cycle or of a next cycle, begins.

In addition, a clock signal may include clock pulses that are formed or defined by the rising and falling edges of the clock signal. In particular example configurations, the clock pulses of a clock signal correspond to the high level of the clock signal, in that each clock pulse is defined by a rising edge followed by a period where the clock signal is at its high level, and then followed by a falling edge. A pulse width of a given clock pulse is a time duration extending from a time that the magnitude of the rising edge of the clock pulse is at or rises to a predetermined level (e.g., 50% of the high level) to a time that the magnitude of the falling edge of the clock pulse is at or falls to the predetermined level. The clock pulses of the clock signal may occur according to the frequency of the clock signal.

Additionally, a data signal is a signal that carries and/or includes data. The data carried by and/or included in a data signal includes a bit sequence of bits, where each bit includes or has a single-bit logic value of "1" or "0". The data signal may include a series or sequence of data pulses corresponding to a bit sequence of the data. Each data pulse may be at a level that indicates a data value, otherwise referred to as a logic level or a logic value. In addition, each data value is represented by a binary number or a binary value that includes one or more digits corresponding to and/or representing the one or more bits of the bit sequence. A duration of a data pulse is an amount of time that the level of the data pulse indicates the data value that the data pulse represents.

FIG. 2A shows a timing diagram of magnitude waveform of a portion of an example ith data signal DQ(i) representative of one of the input data signals DQ(1) to DQ(N). For purposes of illustration, the ith data signal DQ(i) shown in FIG. 2A includes seven data pulses. Each data pulse is shown as being either at a high level at or above a minimum high level $V_{H\_MIN}$ or at a low level at or below a maximum low level $V_{L\_MAX}$. For the example data signal DQ(i) in FIG. 2A, the high level and the low level each indicate a single-bit logic value of "1" or "0", where the high level corresponds to and/or indicates a single-bit logic value of "1" (otherwise referred to as a logic 1 value) and the low level corresponds to and/or indicates a single-bit logic value of "0" (otherwise referred to as a logic 0 value). Other example data signals where different levels of the magnitude waveform correspond to and/or indicate multi-bit logic values (i.e., logic values that each include two or more digits or bits) may be possible.

For two consecutive data pulses of the ith data signal DQ(i), where the two consecutive pulses correspond to different logic levels, the data signal DQ(i) performs a rising transition or a falling transition to transition between the two consecutive data pulses. For the example shown in FIG. 2A, where one pulse in the sequence indicates a logic 0 value and a next pulse in the sequence indicates a logic 1 value, the ith data signal DQ(i) performs a rising transition to transition between the first and second pulses. On the other hand, where one pulse corresponds to a logic 1 value and a next pulse indicates a logic 0 value, the ith data signal DQ(i) performs a falling transition to transition between the first and second pulses. In addition, where two consecutive pulses indicate the same logic level, then as the pulse sequence transitions from the first data pulse to the next data pulse, the level of the ith data signal DQ(i) stays the same during those two pulses, and a rising transition or a falling transition may not occur. Regardless of whether a change in level of the ith data signal DQ(i) occurs when transitioning between two consecutive data pulses, the start of a given data pulse is referred to as a starting transition of the data pulse, and the end of a given data pulse is referred to as an ending transition of the data pulse.

In some embodiments, the receiving circuit 104 might possibly invert the data signal as the data signal is being processed. In one embodiment, the receiving circuit 104 inverts the data signal by passing the data signal through an odd number of inverters. FIG. 2B depicts an inverted version of the data signal of FIG. 2A. Inverting the data signal causes the low voltage pulses of the data signal to be high voltage pulses, and causes the high voltage pulses of the data signal to be low voltage pulses. Also, inverting the data signal causes a "0" to be a "1", and likewise causes a "1" to be a "0".

Referring again to FIG. 1, the receiving circuit 104 may include sampling circuitry that performs sampling actions to identify data values of data carried by the input data signals DQ. As used herein, a sampling action is an action performed to determine, identify, detect, capture, obtain, or latch onto, a level or magnitude of a signal at a given point in time. A circuit that performs sampling actions is referred to as a sampling circuit, and the signal on which the sampling circuit performs a sampling action is referred to as an input signal of the sampling circuit. A sampling circuit performing a sampling action on an input signal may include an input terminal configured to receive the input signal. In addition, a sampling circuit performing a sampling action may output or present the level of the input signal that it identifies. The sampling circuit may do so by generating an output signal at an output terminal of the sampling circuit at a level that indicates or corresponds to the level of the input signal that the sampling circuit identifies at its input terminal. Accordingly, a sampling circuit samples an input signal, samples a level of the input signal, or performs a sampling action on an input signal by identifying a level of an input signal and outputting an output signal at a level indicating the level of the input signal that it identifies.

In particular example configurations, the sampling circuit generates its output signal at a level that matches, directly corresponds to, or is equal in value to the level of the input signal that it identifies. For example, if the sampling circuit identifies its input signal at a low level, then the sampling circuit performs a sampling action by generating its output signal at its output terminal at a low level, and if the sampling circuit identifies its input signal at a high level, then the sampling circuit performs a sampling action by generating its output signal at its output terminal at a high level.

In addition, a sampling circuit performs sampling actions in response to detecting a transition in a clock. The clock transition may be a rising transition or a falling transition, although in some embodiments, sampling transitions may include both rising transitions and falling transitions. Each time a sampling circuit detects a clock transition, the sampling circuit samples the input signal. The input signal that a sampling circuit samples is referred to as its input data signal, and the output signal that a sampling circuit generates and outputs in response to performing sampling actions on the input signal is referred to as its output data signal.

The sampling circuitry of the receiver circuit 104 may include a separate sampling circuit for each input data signal D1(1) to DQ(N). Each of the sampling circuits is configured to sample the levels of a respective one of the data signals DQ(1) to DQ(N). An example sampling circuit is a flip flop, such a D flip flop for example.

Figure 3:
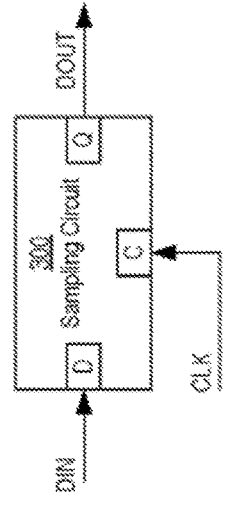
FIG. 3 is a block diagram of an example sampling circuit.

FIG. 3 is a block diagram of an example sampling circuit 300, such as a flip flop or a latch. The sampling circuit 300 includes a data input terminal or node D, a data output terminal or node Q and a clock input terminal or node C. The data input terminal D is configured to receive an input data signal DIN of which the sampling circuit 300 is configured to sample. The clock input terminal C is configured to receive a clock signal CLK of which the sampling circuit 300 is configured to detect sampling transitions. The data output terminal Q is configured to output an output data signal DOUT at levels and at times based on the levels of the input data signal DIN and the sampling transitions of the clock signal CLK. In particular, the sampling circuit 300 is configured to detect when each of the sampling transitions of the clock signal CLK occur. When the sampling circuit 300 detects that a sampling transition occurs, the sampling circuit 300 samples the level of the input data signal DIN at the data input terminal D, and generates the output data signal DOUT at the level of the input data signal DIN that the sampling circuit 300 identified. The sampling circuit 300 maintains or holds the output data signal DOUT at the data output terminal Q at the level it identified until it detects the next sampling transition of the clock signal CLK. Upon detecting the next sampling transition of the clock signal CLK, the sampling circuit 300 will again identify the level of the input data signal DIN at the data input terminal D, and generate the output data signal DOUT at the level of the input data signal DIN that the sampling circuit 300 identified in response to the next sampling transition. The sampling circuit 300 may continue to operate in this manner as it continues to receive additional data pulses of the input data signal DIN and detect sampling transitions of the clock signal CLK.

Figure 4:
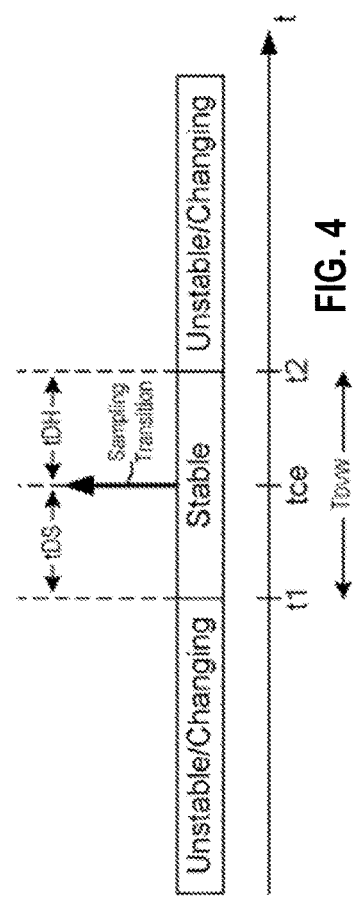
FIG. 4 is a schematic diagram of setup and hold time requirements of the sampling circuit of FIG. 3

FIG. 4 is a schematic diagram illustrating setup time and hold time requirements of the sampling circuit 300. A sampling transition of the clock signal CLK is shown as occurring at a clock event time tce. An occurrence of a sampling transition of the clock signal CLK may be referred to as a clock event. When the sampling circuit 300 detects a sampling transition, it detects a clock event. A time duration from a first time t1 to the clock event time tce denotes the setup time tDS, and a time duration from the clock event time tce to a second time denotes the hold time tDH. In order to meet the setup and hold requirements of the sampling circuit 300, the level of a data pulse of the input data signal DIN should be stable from the first time t1 to the second time t2. A setup violation occurs when the level of input data signal DIN is unstable (it is still changing) after the first time t1 occurs. In other words, a setup violation occurs when the actual amount of time that the level of the input data signal DIN is stable before occurrence of the sampling transition at the clock event time tce is less than the amount of the setup time tDS. In addition, a hold violation occurs when the level of the input data signal DIN is unstable (it changes) before the second time t2. In other words, a hold violation occurs when the actual amount of time that the level of the input data signal DIN is stable after occurrence of the sampling transition at the clock event time tce is less than the amount of the hold time tDH.

For a data pulse of the input data signal DIN that the sampling circuit 300 is to sample, at least a portion of the duration that a level of the data pulse is stable—e.g., at least a portion of the duration that the data pulse is at the high level or at the low level—defines a data valid window $T_{DVW}$. A data valid window $T_{DVW}$ is a time period or duration over which a given data pulse occurs during which a sampling circuit is to detect a sampling transition of the clock signal in order to avoid a setup violation and a hold violation. If the sampling transition occurs before the start of the data valid window $T_{DVW}$, then a setup violation occurs—either because the sampling transition occurred before the starting transition of the data pulse, or because the sampling transition occurred too close to after the starting transition that the actual amount of time that the level of the data pulse is stable before occurrence of the sampling transition is less than the setup time tDS. In addition, if the sampling transition occurs after the end of the data valid window $T_{DVW}$, then a hold violation occurs—either because the sampling transition occurred after the ending transition of the data pulse or occurred too close to before the ending transition that the actual amount of time that the level of the data pulse is stable after occurrence of the sampling transition is less than the hold time tDH.

Ideally, the sampling circuit 300 receives the clock signal CLK and the input data signal DIN relative to each other such that the sampling circuit 300 reliably or accurately samples the level of each data pulse in order to correctly identify the data value that each data pulse represents. Configuring the sampling circuit 300 to sample each data pulse in the middle or at a middle point of the duration of each pulse may maximize the chances of this ideal situation occurring. The ideal time at which to sample a data pulse is referred to as a target sampling time of the data pulse. Ideally, the sampling circuit 300 identifies sampling transitions in the middle of the durations of the data pulses and/or at the target sampling times of the data pulses. Accordingly, a given sampling transition is in a target sampling position when the sampling transition occurs at the target sampling time of its associated data pulse.

Figure 5:
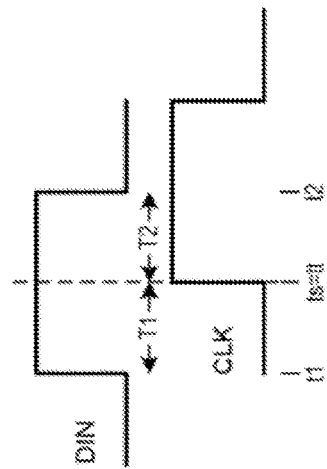
FIG. 5 is a timing diagram of a sampling transition of a clock signal in a target sampling position.

FIG. 5 shows a data pulse of the input data signal DIN and a pulse of the clock signal CLK, illustrating the ideal case where a sampling transition of the clock pulse is in the target sampling position. In FIG. 5, a starting transition of the data pulse occurs at a first time t1, and an ending transition of the data pulse occurs at a second time t2. A target sampling time tt of the data pulse occurs in the middle between the first time t1 and the second time t2. Accordingly, a first time period T1 extending from the first time t1 to the target sampling time tt is the same as or equal to a second time period T2 extending from the target sampling time tt to the second time t2. Additionally, the sampling transition associated with the data pulse is the rising transition of the clock pulse. The sampling transition occurs at a sampling time ts. In FIG. 5, for the ideal case, the sampling transition occurs at the target sampling time—i.e., the sampling time ts and the target sampling time tt are the same.

In actuality, when the sending circuit 102 sends the data signals DQ and the clock signal CLK to the receiving circuit 104, the sampling circuitry of the receiving circuit 104 may not receive the clock pulses in their respective target sampling positions. For a given sampling circuit that samples data pulses of an input data signal in response to sampling transitions of a clock signal, where the sampling transitions occur at times different than the target sampling times tt, the input data signal and the clock signal have skew between them. In general, as used herein, skew between a clock signal and a data signal is a deviation of a sampling transition of the clock signal from a target sampling position to sample a data pulse of the data signal. In addition, with respect to sampling times, skew between a clock signal and a data signal is a deviation of a sampling time ts from a target sampling time tt to sample a data pulse of a data signal. For a given pair of clock and data signals, where the clock signal performs sampling transitions at sampling times ts that match or occur at the same times as the target sampling times tt, the clock and data signals do not have skew between them. Alternatively, where the clock signal performs sampling transitions at sampling times ts different than the target sampling times tt (i.e., before or after the target sampling times tt), the clock and data signals have skew between them. An amount of skew (or skew amount) may be quantified by the difference in time between the sampling time ts and the target sampling time tt.

Various manufacturing or environmental conditions may cause skew between clock and data signals, such as imperfections in the alignment and transmission of the clock and data signals by the sending circuit 102, differences in propagation delay in the lines of the communications bus 106, or process-voltage-temperature (PVT) fluctuations, as non-limiting examples. Not only do such manufacturing or environmental conditions displace sampling transitions of the clock signal CLK from their target sampling positions, but they may displace the sampling transitions by different amounts for sampling different data signals DQ. That is, for sampling circuits that sample the input data signals DQ in response to sampling transitions of the clock signal CLK, some sampling circuits may receive sampling transitions of the clock signal CLK further away from the target sampling transitions than others. As operating frequencies continue to increase, differences in timing between the clock signal CLK and different data signals DQ may be more pronounced, requiring correction processes that can flexibly or independently correct for differences in timing for multiple data signals DQ.

Figure 6A:
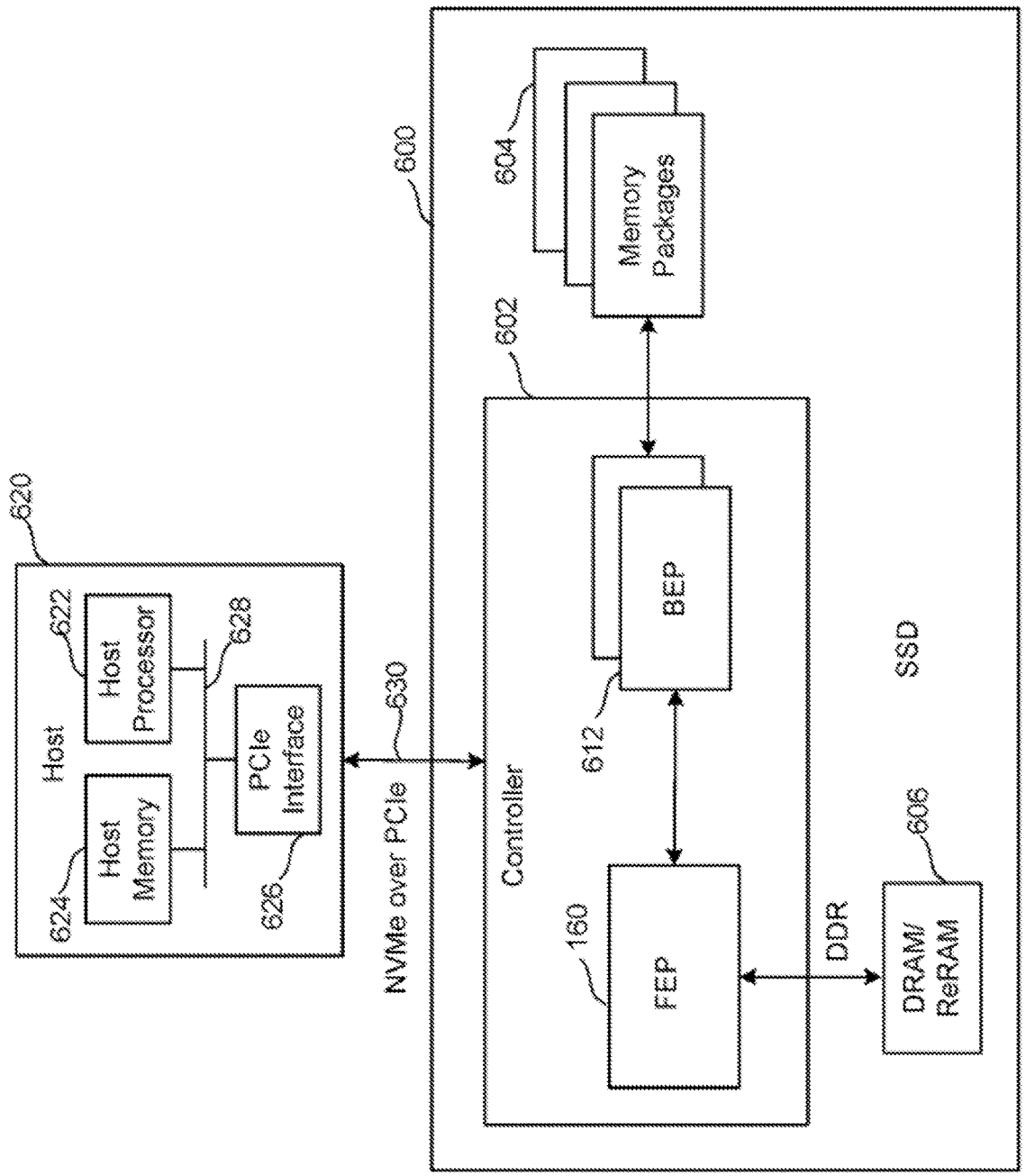
FIG. 6A is a block diagram of one embodiment of a storage device connected to a host.

FIGS. 6A, 6B, 7, 8, and 9 depict an example memory system in which various embodiments of the present disclosure. FIG. 6A is a block diagram of one embodiment of a storage device 600 connected to a host 620. Storage device 600 can implement the technology proposed herein. Many different types of storage devices can be used with the technology proposed herein. One example storage device is a solid state device (SSD); however, other types of storage devices can also be used. Storage device 600 comprises a Controller 602, non-volatile memory 604 for storing data, and local memory (e.g. DRAM/ReRAM) 606. Controller 602 comprises a Front End Processor Circuit (FEP) 610 and one or more Back End Processor Circuits (BEP) 612. In one embodiment, FEP 610 circuit is implemented on an ASIC. In one embodiment, each BEP circuit 612 is implemented on a separate ASIC. The ASICs for each of the BEP circuits 612 and the FEP circuit 610 are implemented on the same semiconductor such that the Controller 602 is manufactured as a System on a Chip (SoC). FEP 610 and BEP 612 both include their own processors. In one embodiment, FEP 610 and BEP 612 work as a master slave configuration where the FEP 610 is the master and each BEP 612 is a slave. For example, FEP circuit 610 implements a flash translation layer that performs memory management (e.g., garbage collection, wear leveling, etc.), logical to physical address translation, communication with the host, management of DRAM (local volatile memory) and management of the overall operation of the SSD (or other non-volatile storage device). The BEP circuit 612 manages memory operations in the memory packages/die at the request of FEP circuit 110. For example, the BEP circuit 612 can carry out the read, erase, and programming processes. Additionally, the BEP circuit 612 can perform buffer management, set specific voltage levels required by the FEP circuit 610, perform error correction, control the Toggle Mode interfaces to the memory packages, etc. In one embodiment, each BEP circuit 612 is responsible for its own set of memory packages. Controller 602 is one example of a control circuit In one embodiment, non-volatile memory 604 comprises a plurality of memory packages. Each memory package includes one or more memory die. Therefore, Controller 602 is connected to one or more non-volatile memory die. In one embodiment, each memory die in the memory packages 604 utilize NAND flash memory (including two dimensional NAND flash memory and/or three dimensional NAND flash memory). In other embodiments, the memory package can include other types of memory.

Controller 602 communicates with host 620 via an interface 630 that implements NVM Express (NVMe) over PCI Express (PCIe). For working with storage device 600, host 620 includes a host processor 622, host memory 624, and a PCIe interface 626 connected to bus 628. Host memory 624 is the host's physical memory, and can be DRAM, SRAM, non-volatile memory, or another type of storage. Host 620 is external to and separate from storage device 600. In one embodiment, storage device 600 is embedded in host 620. Any combination of one or more of storage device 600, controller 602, FEP 610, BEP 612, and/or memory packages 604 may be referred to herein as an apparatus. In operation, when the host 620 needs to read data from or write data to the non-volatile memory 604, it will communicate with the controller 602. If the host 620 provides a logical address to which data is to be read/written, the controller can convert the logical address received from the host to a physical address in the non-volatile memory 604.

Figure 6B:
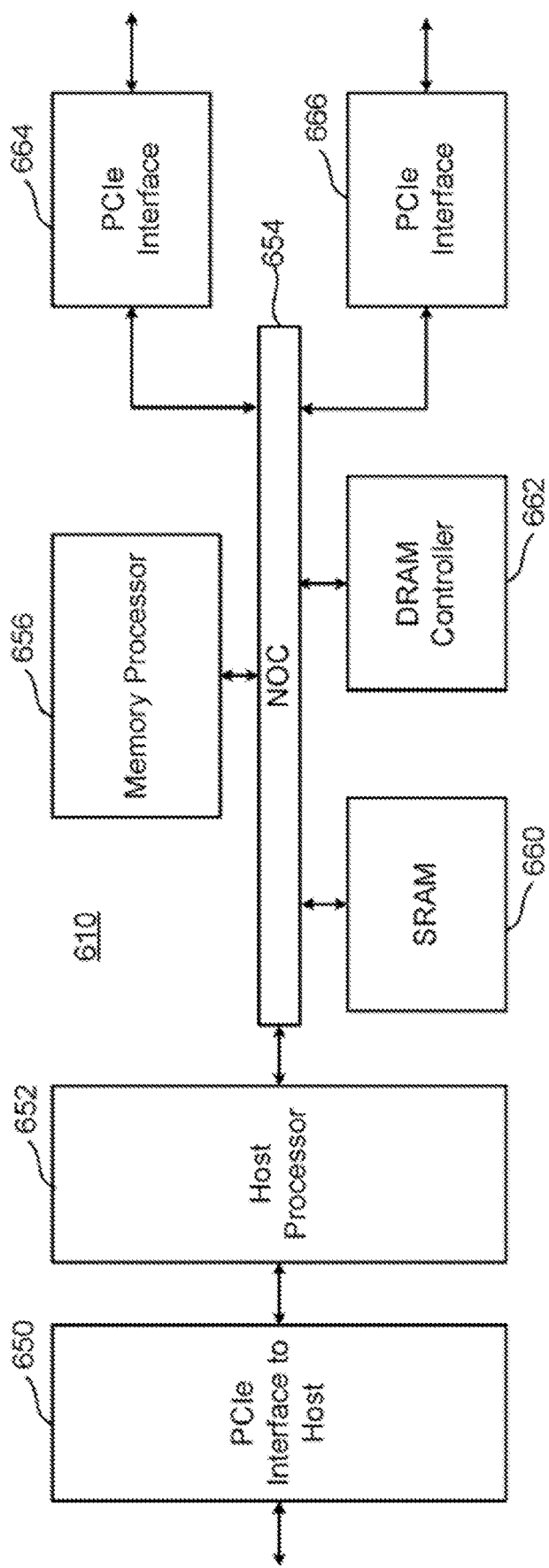
FIG. 6B is a block diagram of one embodiment of a Front End Processor Circuit. In some embodiments, the Front End Processor Circuit is part of a Controller.

FIG. 6B is a block diagram of one embodiment of FEP circuit 610. FIG. 6B shows a PCIe interface 650 to communicate with host 620 and a host processor 652 in communication with that PCIe interface. The host processor 652 can be any type of processor known in the art that is suitable for the implementation. Host processor 652 is in communication with a network-on-chip (NOC) 654. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 654 is the memory processor 656, SRAM 660 and a DRAM controller 662. The DRAM controller 662 is used to operate and communicate with the DRAM (e.g., DRAM 606). SRAM 660 is local RAM memory used by memory processor 656. Memory processor 656 is used to run the FEP circuit and perform the various memory operations. Also in communication with the NOC are two PCIe Interfaces 664 and 666. In the embodiment of FIG. 6B, the SSD controller will include two BEP circuits 612; therefore there are two PCIe Interfaces 664/666. Each PCIe Interface communicates with one of the BEP circuits 612. In other embodiments, there can be more or less than two BEP circuits 612; therefore, there can be more than two PCIe Interfaces.

Figure 7:
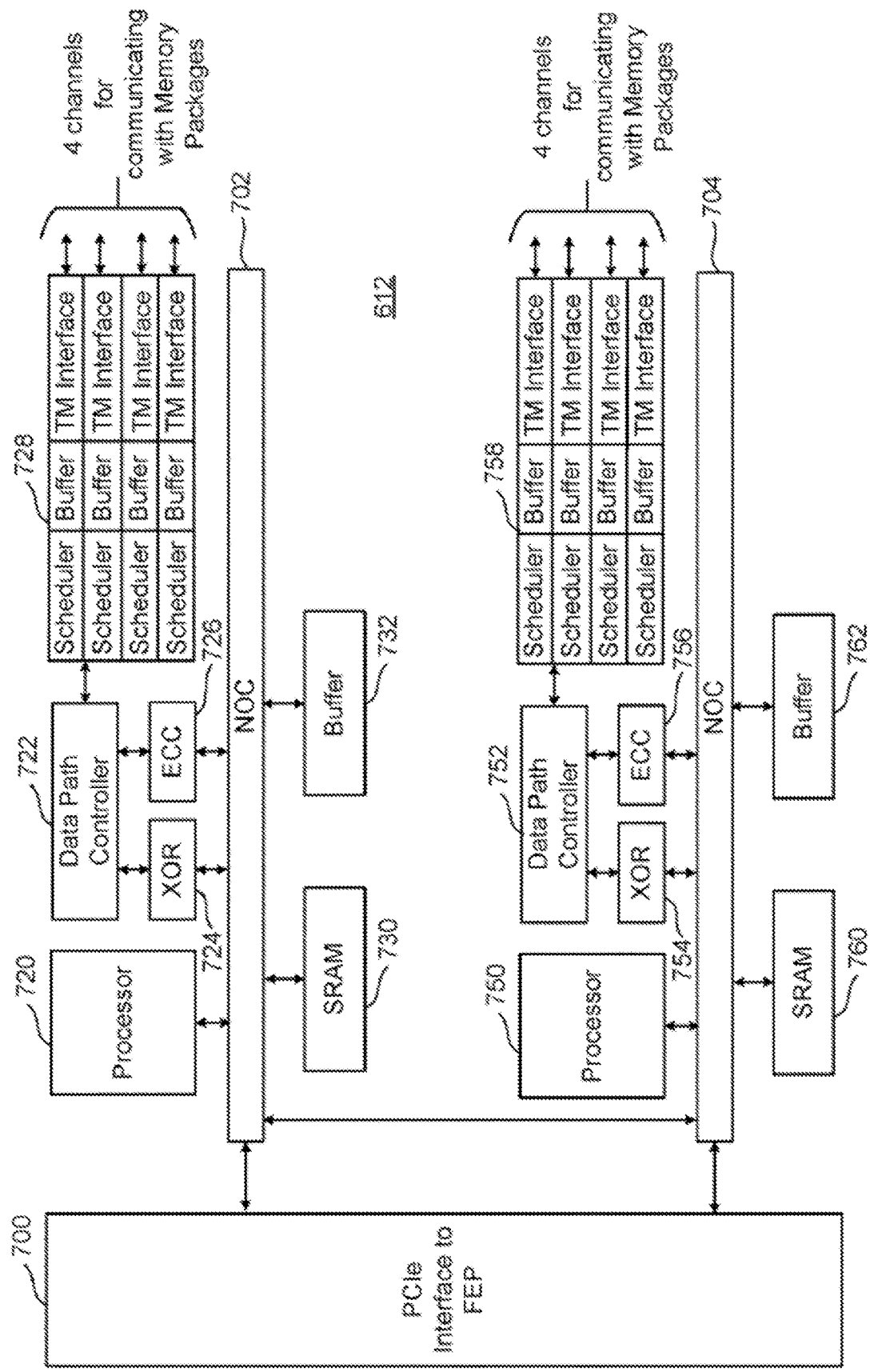
FIG. 7 is a block diagram of one embodiment of a Back End Processor Circuit. In some embodiments, the Back End Processor Circuit is part of a Controller.

FIG. 7 is a block diagram of one embodiment of the BEP circuit 612. FIG. 7 shows a PCIe Interface 700 for communicating with the FEP circuit 610 (e.g., communicating with one of PCIe Interfaces 664 and 666 of FIG. 6B). PCIe Interface 700 is in communication with two NOCs (Network-on-a-Chip) 702 and 704. In one embodiment, the two NOCs can be combined to one large NOC. Each NOC (702/704) is connected to SRAM (730/760), a buffer (732/762), processor (720/750), and a data path controller (722/752) via an XOR engine (724/754) and an ECC engine (726/756). The ECC engines 726/756 are used to perform error correction, as known in the art. The XOR engines 724/754 are used to XOR the data so that data can be combined and stored in a manner that can be recovered in case there is a UECC failure. In an embodiment, XOR engines 724/754 form a bitwise XOR of different pages of data. The XOR result may be stored in a memory package 604. In the event that an ECC engine 726/756 is unable to successfully correct all errors in a page of data that is read back from a memory package 604, the stored XOR result may be accessed from the memory package 604. The page of data may then be recovered based on the stored XOR result, along with the other pages of data that were used to form the XOR result.

Data path controller 722 is connected to an interface module for communicating via four channels with memory packages. Thus, the top NOC 702 is associated with an interface 728 for four channels for communicating with memory packages and the bottom NOC 704 is associated with an interface 758 for four additional channels for communicating with memory packages. Each interface 728/

758 includes four Toggle Mode interfaces (TM Interface), four buffers and four schedulers. There is one scheduler, buffer, and TM Interface for each of the channels. The processor can be any standard processor known in the art. The data path controllers 722/752 can be a processor, FPGA, microprocessor, or other type of controller. The XOR engines 724/754 and ECC engines 726/756 are dedicated hardware circuits, known as hardware accelerators. In other embodiments, the XOR engines 724/754 and ECC engines 726/756 can be implemented in software. The scheduler, buffer, and TM Interfaces are hardware circuits.

Interfaces 728/758, alone or in combination, may be referred to as a memory interface configured to be connected to non-volatile memory (e.g., memory package 604). A combination of one or more of processor 720/750, data path controller 722/752, XOR 724/754, ECC 726/756 may be referred to herein as a processor circuit. The buffer 732/762, SRAM 730/760, and/or NOCs 702/704 may also be considered to be a part of the processor circuit.

Figure 8:
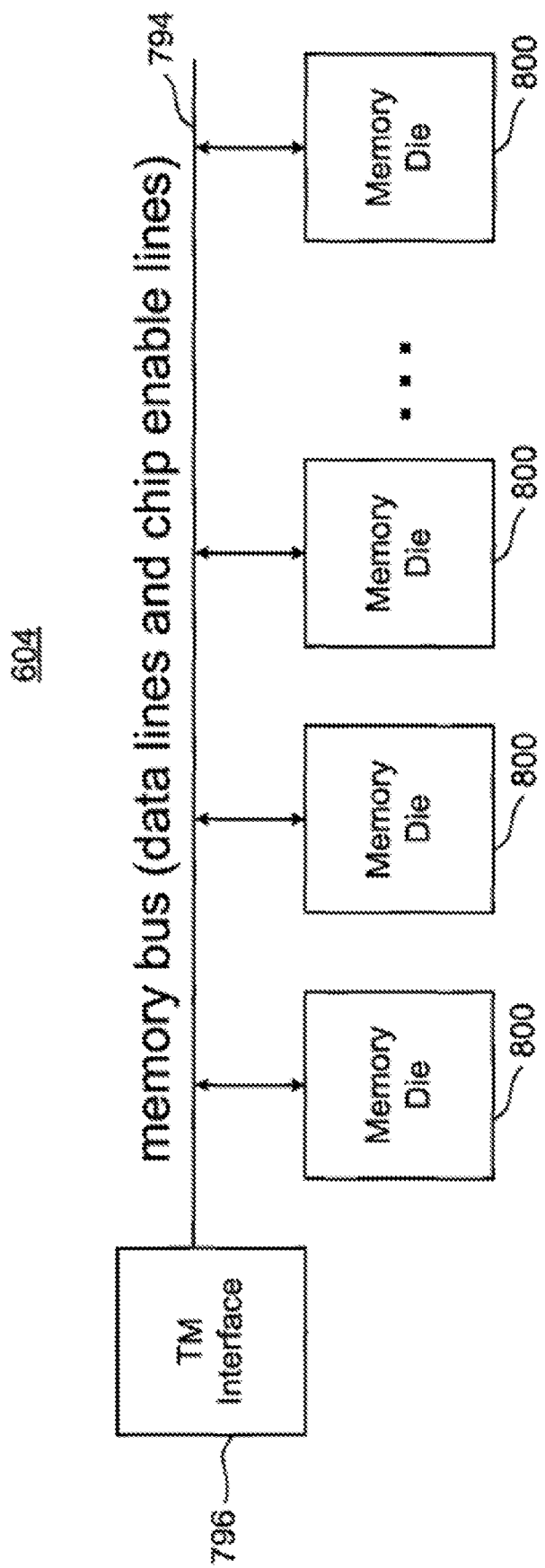
FIG. 8 is a block diagram of one embodiment of a memory package.

FIG. 8 is a block diagram of one embodiment of a memory package 604 that includes a plurality of memory die 800 connected to a memory bus (data lines and chip enable lines) 794. The memory bus 794 connects to a Toggle Mode Interface 796 for communicating with the TM Interface of a BEP circuit 612 (see e.g., FIG. 7). In some embodiments, the memory package can include a small controller connected to the memory bus and the TM Interface. The memory package can have one or more memory die. In one embodiment, each memory package includes eight or 66 memory die; however, other numbers of memory die can also be implemented. The technology described herein is not limited to any particular number of memory die.

Figure 9A:
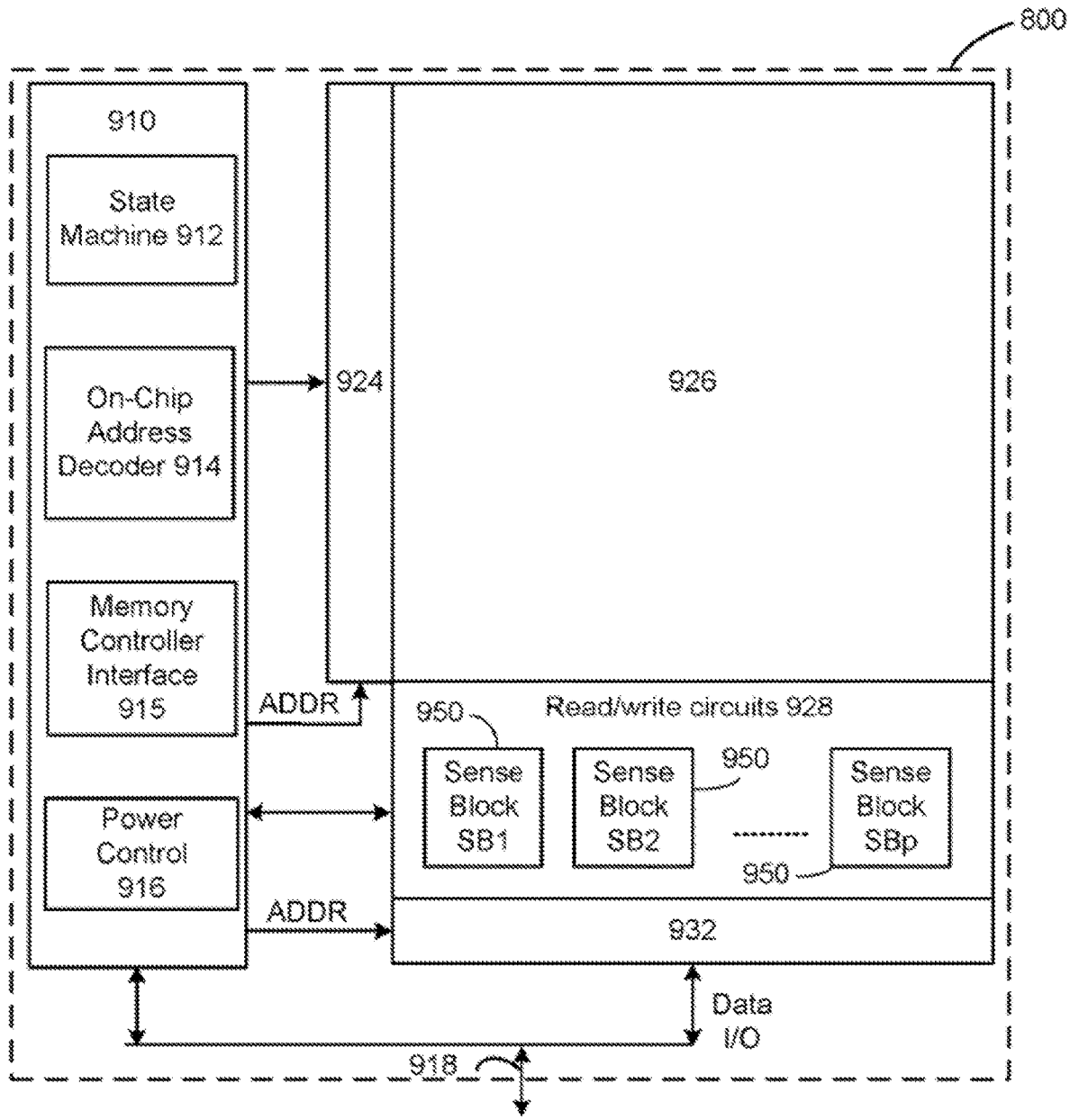
FIG. 9A is a block diagram of one embodiment of a memory die.

FIG. 9A is a functional block diagram of one embodiment of a memory die 800. Each of the one or more memory die 800 of FIG. 8 can be implemented as memory die 800 of FIG. 9A. The components depicted in FIG. 9A are electrical circuits. In one embodiment, each memory die 800 includes a memory structure 926, control circuitry 910, and read/write circuits 928, all of which are electrical circuits. Memory structure 926 is addressable by word lines via a row decoder 924 and by bit lines via a column decoder 932. The read/write circuits 928 include multiple sense blocks 950 including SB1, SB2, . . . , SBp (sensing circuitry) and allow a page (or multiple pages) of data in multiple memory cells to be read or programmed in parallel. In one embodiment, each sense block includes a sense amplifier and a set of latches connected to the bit line. The latches store data to be written and/or data that has been read. The sense blocks include bit line drivers.

Commands and data are transferred between the controller 602 and the memory die 800 via memory controller interface 915. Examples of memory controller interface 915 include a Toggle Mode Interface and an Open NAND Flash Interface (ONFI). Other I/O interfaces can also be used.

Control circuitry 910 cooperates with the read/write circuits 928 to perform memory operations (e.g., write, read, erase, and others) on memory structure 926. In one embodiment, control circuitry 910 includes a state machine 912, an on-chip address decoder 914, a power control module 916, and a memory controller interface 915. State machine 912 provides die-level control of memory operations. In one embodiment, state machine 912 is programmable by software. In other embodiments, state machine 912 does not use software and is completely implemented in hardware (e.g., electrical circuits). In some embodiments, state machine 912 can be replaced by a microcontroller or microprocessor. In one embodiment, control circuitry 910 includes buffers such as registers, ROM fuses and other storage devices for storing default values such as base voltages and other parameters. The default values and other parameters could be stored in a region of the memory structure 926.

The on-chip address decoder 914 provides an address interface between addresses used by controller 602 to the hardware address used by the decoders 924 and 932. Power control module 916 controls the power and voltages supplied to the word lines and bit lines during memory operations. Power control module 916 may include charge pumps for creating voltages.

Memory controller interface 915 is an electrical interface for communicating with memory controller 602. For example, memory controller interface 915 may implement a Toggle Mode Interface that connects to the Toggle Mode interfaces of memory interface 228/258 for memory controller 602. In one embodiment, memory controller interface 915 includes a set of input and/or output (I/O) pins that connect to communication channel 918 (also refers to herein as a data bus). In one embodiment, communication channel 918 connects to the memory controller 602 as part of the Toggle Mode Interface.

For purposes of this document, control circuitry 910, alone or in combination with read/write circuits 928 and decoders 924/932, comprise one or more control circuits connected to memory structure 926. This one or more control circuits are an electrical circuit that performs the functions described below in the flow charts. In other embodiments, the one or more control circuits can consist only of controller 602 (or other controller), which is an electrical circuit in combination with software (e.g., firmware), that performs the functions described below in the flow charts. In one embodiment, the one or more control circuits is the controller where the controller is an electrical circuit that does not use hardware. In another alternative, the one or more control circuits comprises controller 602 and control circuitry 910 performing the functions described below in the flow charts. In another embodiment, the one or more control circuits comprises state machine 912 (and/or a microcontroller and/or microprocessor) alone or in combination with controller 602. In another alternative, the one or more control circuits comprises controller 602, control circuitry 910, read/write circuits 928 and decoders 924/932 performing the functions described below in the flow charts. In other embodiments, the one or more control circuits comprises one or more electrical circuits that operate the non-volatile memory. The term apparatus as used herein may include, but is not limited to, memory die 800, non-volatile memory 604, storage device 600, or a host system 620 that includes a storage device 600.

In one embodiment, memory structure 926 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 926 comprise vertical NAND strings with charge-trapping material such as described, for example, in U.S. Pat. No. 9,721,662, incorporated herein by reference in its entirety. In another embodiment, memory structure 926 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 926 is not limited to the examples above. Many different types of memory array architectures or memory cell technologies can be used to form memory structure 926. No particular non-volatile memory technology is required for purposes of the new claimed embodiments proposed herein. Other examples of suitable technologies for memory cells of the memory structure 926 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 926 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a Ge.sub.2Sb.sub.2Te.sub.5 alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 9B:
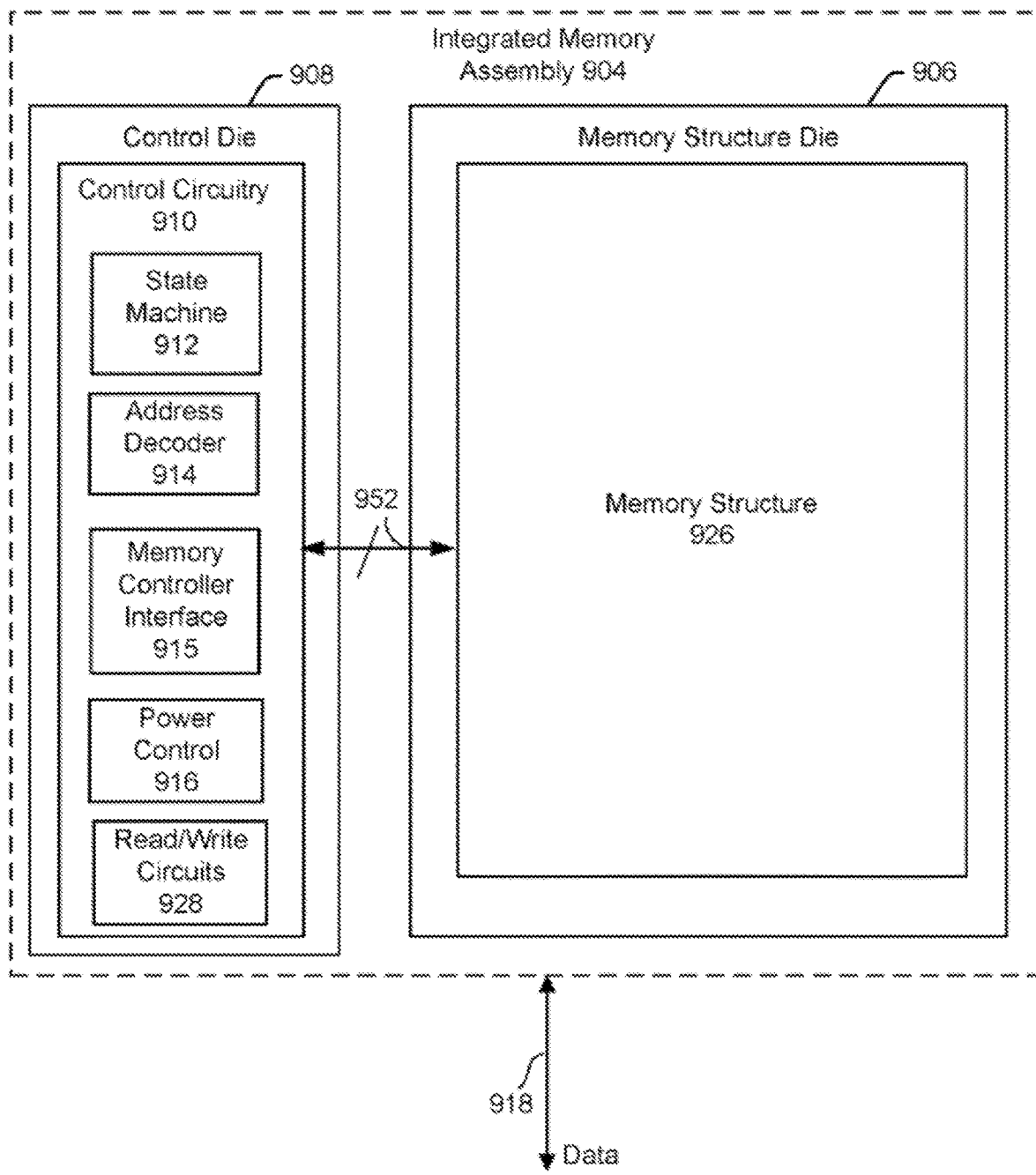
FIG. 9B is a block diagram of one embodiment of an integrated memory assembly.

FIG. 9B depicts a functional block diagram of one embodiment of an integrated memory assembly 904. The integrated memory assembly 904 may be used in a memory package 604 in memory system 600. In one embodiment, the integrated memory assembly 904 includes two types of semiconductor die (or more succinctly, "die"). Memory structure die 906 includes include memory structure 926. Memory structure 926 may contain non-volatile memory cells. Control die 908 includes control circuitry 910. In some embodiments, the memory structure die 906 and the control die 908 are bonded together. The control circuitry includes state machine 912, an address decoder 914, a power control circuit 916, and memory controller interface 915. The control circuitry also includes read/write circuits 928. In another embodiment, a portion of the read/write circuits 928 are located on control die 908, and a portion of the read/write circuits 928 are located on memory die 906.

Any subset of components in the control circuitry 910 can be considered one or more control circuits. The one or more control circuits can include hardware only or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), integrated circuit or other type of circuit.

Pathways 952 are pathways between one or more components in the control circuitry 910 and the memory structure on memory structure die 906. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal.

In one embodiment, integrated memory assembly 904 includes a set of input and/or output (I/O) pins that connect to communication channel 918 (also refers to herein as a data bus). Communication channel 918 is depicted as being connected to integrated memory assembly 904 for generality. Communication channel 918 may connect to either or both of die 906 and/or 908. In one embodiment, communication channel 918 connect the memory controller 602 directly to control die 908.

Figure 10A:
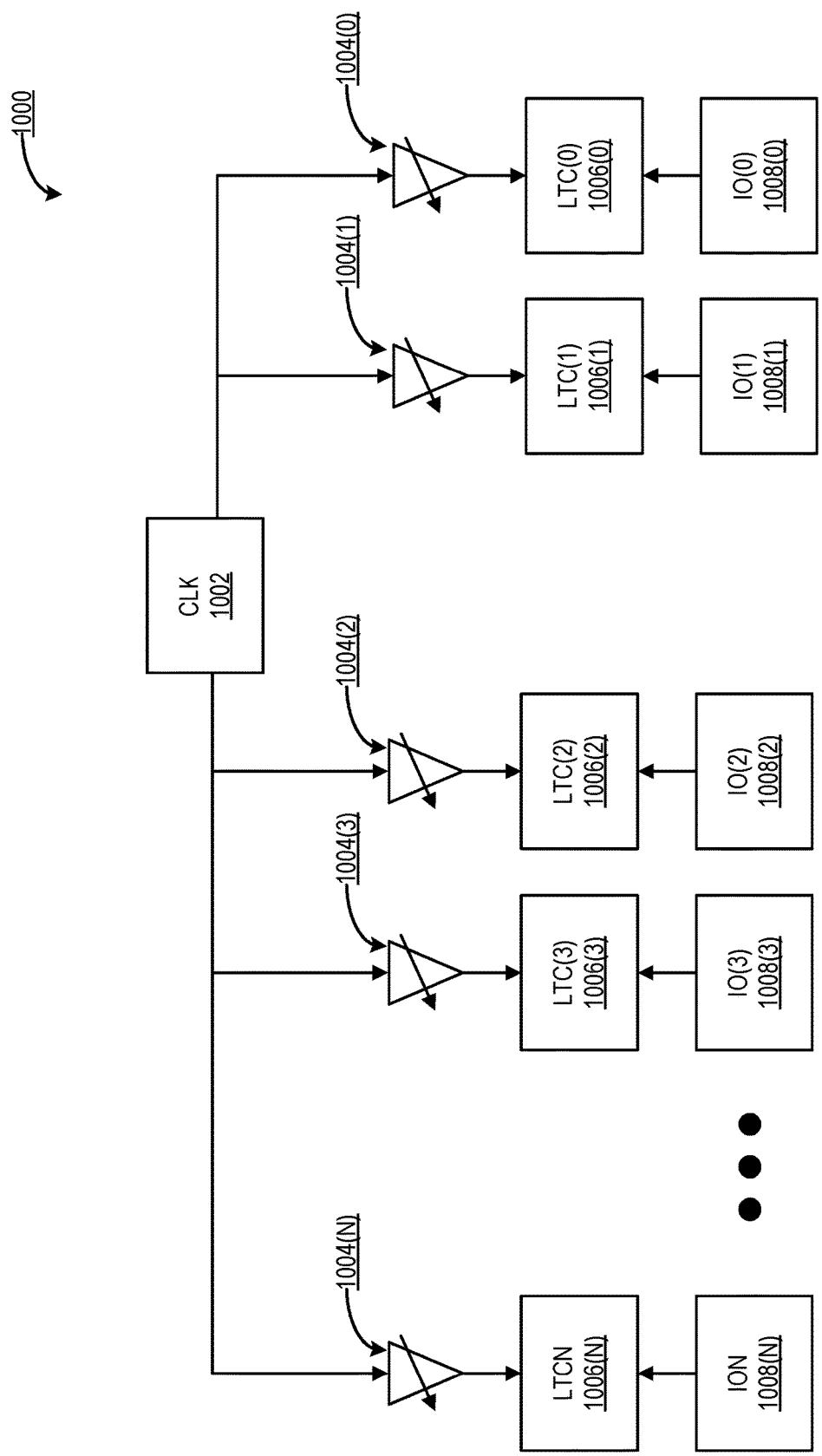
FIG. 10A is a block diagram of one embodiment of an unmatched data input system.

FIG. 10A shows a block diagram of one embodiment of an unmatched data input system 1000. The unmatched data input system 1000 includes a number of latch circuits 1006 that are connected to a number of corresponding input/outputs (IOs) 1008. This configuration can provide improvements with respect to on chip space and power. The unmatched data input system 1000 includes a clock 1002 that provides a clock signal to the latch circuits 1006 and IOs 1008. As the latch circuits 1006 and IOs 1008 are distributed at different distances from the clock 1002, the latch circuits 1006 and the IOs 1008 will receive the clock signal at different timings. The unmatched data input system 1000 includes multi-delay circuits 1004 on the clock paths from the clock 1002 to the latch circuits 1006 and the IOs 1008. These multi-delay circuits provide for calibration of the clock signal distributed to the latch circuits 1006 and the IOs 1008.

The example configuration shown in FIG. 10A includes five latch circuits 1006(0) to 1006(N), although numbers other than five may be used. The second latch circuit 1006(1) and the third latch circuit 1006(2) are the closest to the clock 1002 and receive a clock signal with the least amount of delay compared to the other latch circuits. The first latch circuit 1006(0) and the fourth latch circuit 1006(3) are further from the clock 1002 and receive the clock signal with a greater amount of delay compared to the second latch circuit 1006(1) and the third latch circuit 1006(2). As the latch circuits increase in distance from the clock 1002, the signal received by the latch circuits are increasingly delayed. The furthest latch circuit 1006(N) receives the clock signal with the most amount of delay compared to the other latch circuits. While the example configuration shown in FIG. 10A includes the clock 1002 between the second latch circuit 1006(1) and the third latch circuit 1006(2), other configurations are possible.

Figure 11A:
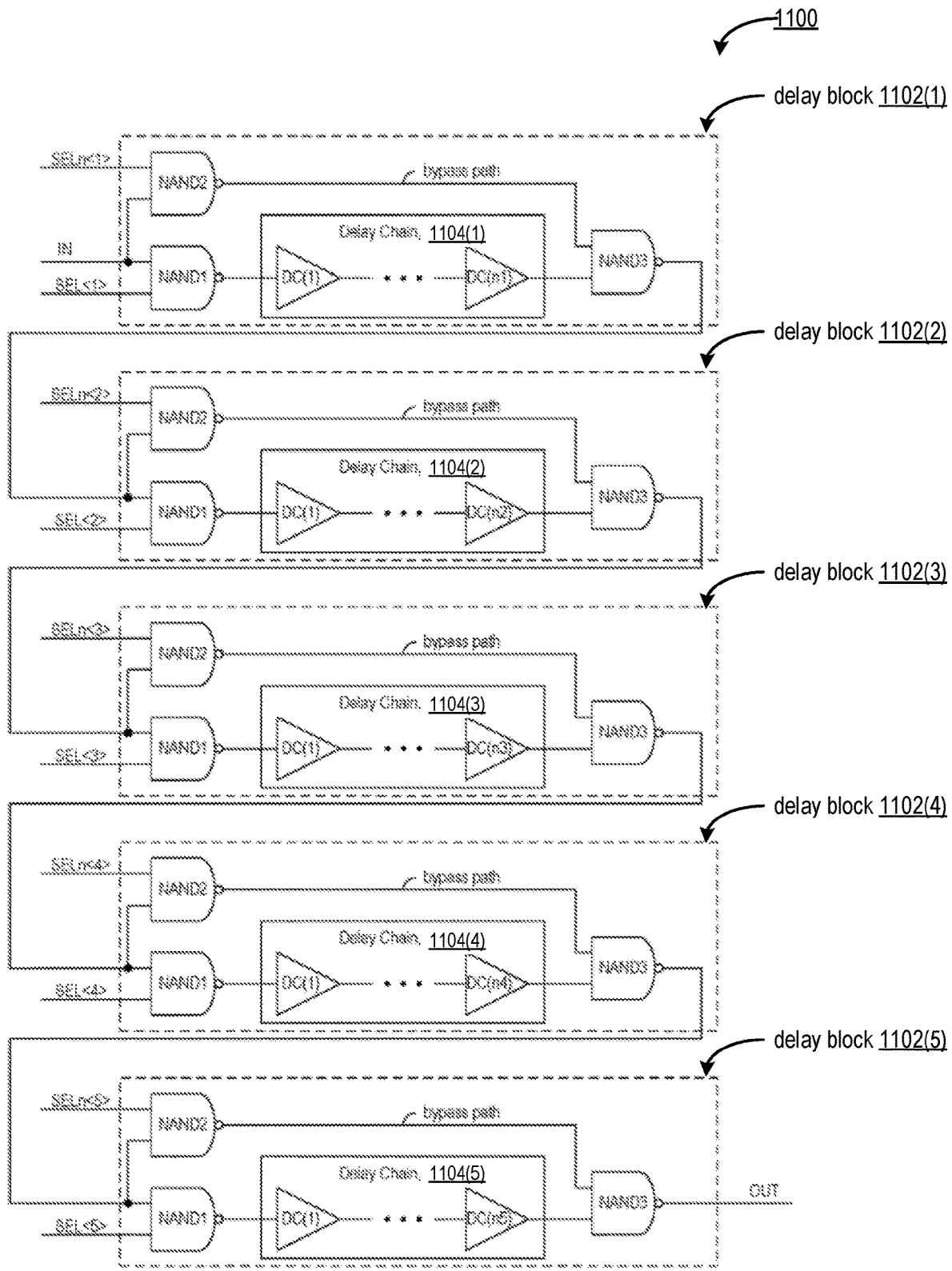
FIG. 11A is a block diagram of one embodiment of a coarse delay circuit.

In addition, as shown in FIG. 11A, the example configuration includes five IOs 1008(0) to 1008(N), although numbers other than five may be used. The IOs 1008 correspond with the latch circuits 1006. Accordingly, the first latch circuit 1006(0) corresponds with the first IO 1008(0), and the first latch circuit 1006(0) receives and holds data provided through the first IO 1008(0). Similarly, the second latch circuit 1006(1) corresponds with the second IO 1008 (1), and the second latch circuit 1006(1) receives and holds data provided through the second IO 1008(1). The third latch circuit 1006(2) corresponds with the third IO 1008(2), and the third latch circuit 1006(2) receives and holds data provided through the third IO 1008(2). The fourth latch circuit 1006(3) corresponds with the fourth IO 1008(3), the fourth latch circuit 1006(3) receives and holds data provided through the fourth IO 1008(3), and so on.

As the latch circuits 1006 experience delays in the clock signal received from the clock 1002, so too do the IOs 1008. In the example configuration shown in FIG. 10A, the second IO 1008(1) and the third IO 1008(2) are the closest to the clock 1002 and receive the clock signal with the least amount of delay compared to the other IOs. The first IO 1008(0) and the fourth IO 1008(3) are further from the clock 1002 and receive the clock signal with a greater amount of delay compared to the second IO 1008(1) and the third IO 1008(2). As the IOs increase in distance from the clock 1002, the signal received by the IOs are increasingly delayed. The furthest IO 1008(N) receives the clock signal with the most amount of delay compared to the other latch circuits. Again, while the example configuration shown in FIG. 10A includes the clock 1002 between the second IO 1008(1) and the third IO 1008(2), other configurations are possible.

To account for the differences in delay in the clock signal distributed to the latch circuits 1006 and the IOs 1008, multi-delay circuits 1004 are configured on the clock path from the clock 1002 to the latch circuits 1006 and the IOs 1008. As shown in FIG. 10A, the example configuration includes five multi-delay circuits 1004(0) to 1004(N), although numbers other than five may be used. The multi-delay circuits 1004 correspond with the latch circuits 1006 and the IOs 1008. Accordingly, the first multi-delay circuit 1004(0) corresponds with the first latch circuit 1006(0) and the first IO 1008(0). The first multi-delay circuit 1004(0) accounts for the delay in the clock signal from the clock 1002 to the first latch circuit 1006(0) and the first IO 1008(0). Similarly, the second multi-delay circuit 1004(1) corresponds with the second latch circuit 1006(1) and the second IO 1008(1). The second multi-delay circuit 1004(1) accounts for the delay in the clock signal from the clock 1002 to the second latch circuit 1006(1) and the second IO 1008(1). The third multi-delay circuit 1004(2) corresponds with the third latch circuit 1006(2) and the third IO 1008(2). The third multi-delay circuit 1004(2) accounts for the delay in the clock signal from the clock 1002 to the third latch circuit 1006(2) and the third IO 1008(2). The fourth multi-delay circuit 1004(3) corresponds with the fourth latch circuit 1006(3) and the fourth IO 1008(3). The fourth multi-delay circuit 1004(3) accounts for the delay in the clock signal from the clock 1002 to the fourth latch circuit 1006(3) and the fourth IO 1008(3), and so on.

As the latch circuits 1006 and the IOs 1008 are associated with corresponding multi-delay circuits 1004, the multi-delay circuits 1004 can separately and independently calibrate the clock signal to the latch circuits 1006 and the IOs 1008 in parallel. Accordingly, the multi-delay circuits can account for the different timings of the clock signal received by the latch circuits and IOs.

Figure 10B:
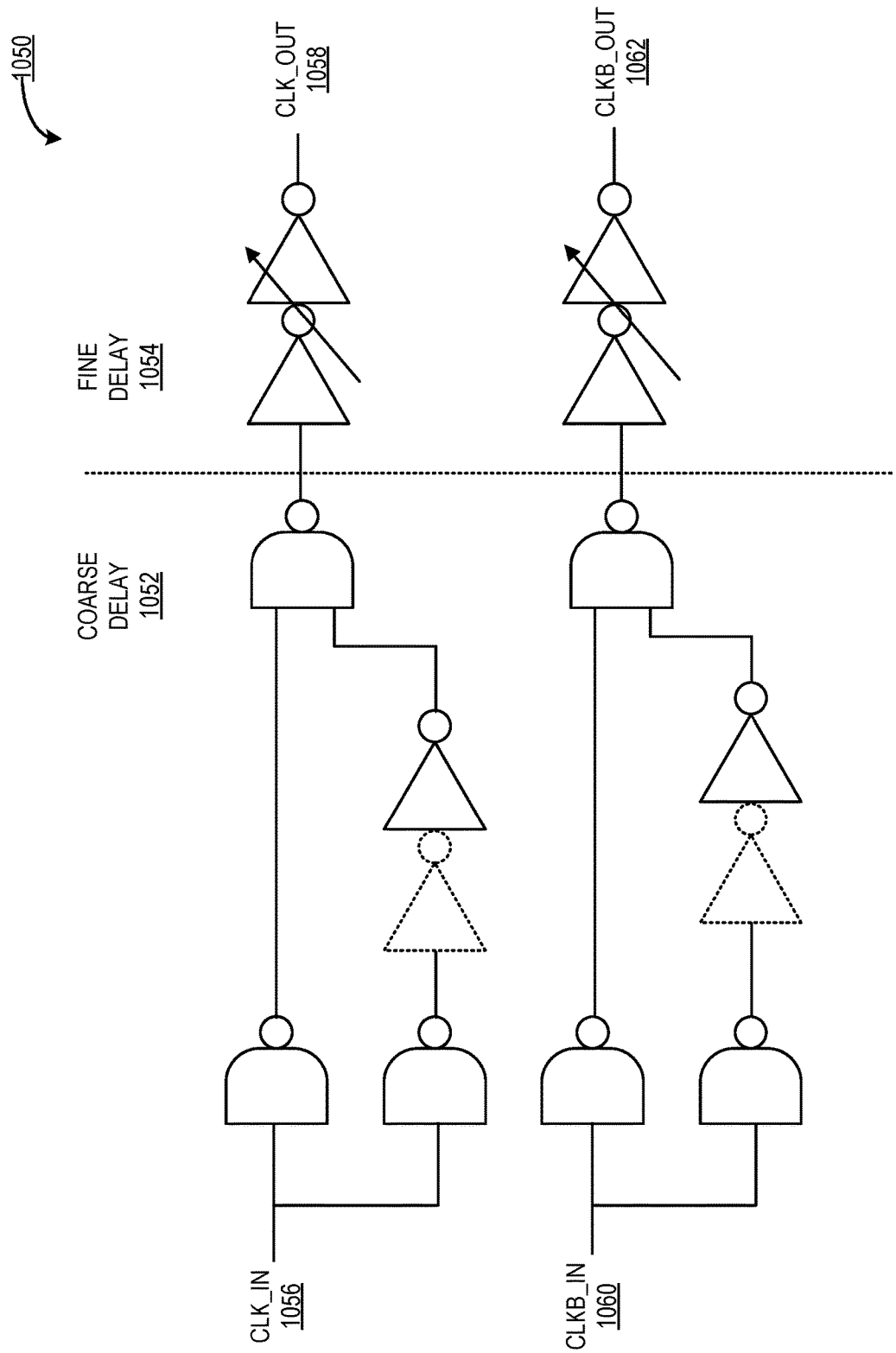
FIG. 10B is a block diagram of one embodiment of a multi-delay circuit.

FIG. 10B shows a block diagram of one embodiment of a multi-delay circuit 1050. As shown in FIG. 10B, the multi-delay circuit 1050 includes a coarse delay circuit 1052 and a fine delay circuit 1054. The multi-delay circuit 1050 may be configured to receive an input clock signal CLK_IN 1056 and a complementary input clock signal CLKB_IN 1060. The multi-delay circuit 1050 delays the input signals CLK_IN 1056 and CLKB_IN 1060 to generate an output clock signal CLK_OUT 1058, which is a delayed version of the input clock signal CLK_IN 1056 and a complementary output clock signal CLKB_OUT 1062, which is a delayed version of the input clock signal CLKB_IN 1060.

The multi-delay circuit 1050 includes a number of coarse delay circuits and a number of fine delay circuits. The example configuration shown in FIG. 10B includes one coarse delay circuit and one fine delay circuit to generate an output clock signal CLK_OUT 1058 from an input clock signal CLK_IN 1056. In addition, the example configuration shown in FIG. 10B includes one coarse delay circuit and one fine delay circuit to generate an output clock signal CLKB_OUT 1062 from an input clock signal CLKB_IN 1060. As further described herein, other numbers of coarse delay circuits and other numbers of fine delay circuits may be used.

In general, a coarse delay circuit may provide a unit of delay that is longer than that provided by a fine delay circuit. By including both coarse delay circuits and fine delay circuits, the multi-delay circuit 1050 can provide a wide range of delay using the coarse delay circuits as well as provide an accurate amount of delay using the fine delay circuits.

FIG. 11A shows a block diagram of one embodiment of a coarse delay circuit 1000. The coarse delay circuit 1000 may be used, for example, as the configuration for the coarse delay circuits 1052 of FIG. 10B. As shown in FIG. 11A, the coarse delay circuit 1100 may be configured to receive an input signal IN, and delay the input signal IN to generate an output signal OUT, which is a delayed version of the input signal IN.

The coarse delay circuit includes a number of delay blocks 1102. The example configuration shown in FIG. 11A includes five delay blocks 1102(1) to 1102(5), although numbers other than five may be used. The first delay block is configured to receive the input signal IN. The other blocks each have their respective input coupled to the output of a prior delay block 1102 of the coarse delay circuit 1100. Hence, the delay blocks 1102 form a chain.

An input signal that each of the delay blocks 1102 receives is referred to as its local input signal. Except for the first delay block 1102(1), each of the blocks 1102 receives its local input signal from a prior delay block 1102 of the coarse delay circuit 1100. Additionally, an output signal that each of the delay blocks 1102 outputs is referred to as its local output signal. Except for the last, or fifth delay block 1102(5), each of the delay blocks 1102 may be configured to output a local output signal to a next delay block 1102 of the coarse delay circuit 1100. Accordingly, the first delay block 1102(1) outputs a local output signal to the second delay block 1102(2), which the second delay block 1102(2) receives as its local input signal, the second delay block 1102(2) outputs a local output signal to the third delay block 1102(3), which the third delay block 1102(3) receives as its local input signal, and so on.

In addition, as shown in FIG. 11A, each delay block 1102 includes a respective delay chain 1104 of delay cells. Each delay cell provides a pre-determined amount of delay. In the embodiment depicted in FIG. 11A, the numbers of delay cells increase by powers of two going from the first delay chain 1104(1) to the last delay chain 1104(5). For example, the first delay chain 1104(1) may include two delay cells, the second delay chain 1104(2) may include four delay cells, the third delay chain 1304(3) may include eight delay cells, the fourth delay chain 1104(4) may include sixteen delay cells, and the fifth delay chain 1104(5) may include thirty-two delay cells. However, the delay chains could be chained in any order. Also, it is not required that each delay chain 1104 have a number of delay cell that is a power of two.

Each delay cell may provide a unit of delay, which may be measured in units of time, such as a number of nanoseconds or picoseconds, for example. Accordingly, the total amount of delay by which delay chain 1104 delays its local input signal is equal to the unit of delay of a delay cell multiplied by the number of delay cells of the delay chain.

In the example configuration shown in FIG. 11A, each delay block 1102 includes three NAND gates, including a first NAND gate NAND1, a second NAND gate NAND2, and a third NAND gate NAND3. For delay block 1102(1) the input is provided to NAND2 and the delay cell DC(1) in the delay chain 1104(1). The first NAND gate NAND1 receives an output signal from the delay chain 1104(1). For the other ith blocks 1102(i), the first and second NAND gates NAND1, NAND2 each include a first input configured to receive a respective local input signal, and a second input terminal configured to receive a bit from an ith pair of complementary bits SEL<i>, SELn<i>. For example, in the configuration shown in FIG. 11A, the first NAND gate NAND1 receives the ith selection signal SEL<i>, and the second NAND gate NAND2 receives the ith complementary selection signal SELn<i>. In accordance with the complementary configuration, an ith pair of complementary selections signals SEL<i>, SELn<i> have opposite logic 1 and logic 0 values. Additionally, for blocks other than 1102(1), the first NAND gate NAND1, which has its second input configured to receive the ith selection signal SEL<i>, has its output coupled to the input of the ith delay chain 1104(i). For all blocks 1102, the second NAND gate NAND2, which has its second input configured to receive the ith complementary selection signal SELn<i>, has its output coupled to the bypass path. For block 1102(1), the third NAND gate NAND3 includes a first input coupled to the output of NAND1, a second input coupled to the bypass path, and an output that functions as the output of the ith delay block 1102(i). For other blocks 1102(2)-1102(5), the third NAND gate NAND3 includes a first input coupled to the output of the ith delay chain 1104(i), a second input coupled to the bypass path, and an output that functions as the output of the ith delay block 1102(i).

As shown in FIG. 11A, each delay block 1102 includes a bypass path, which bypasses a respective delay chain 1104. When a bypass path of a given delay block 1102 is enabled, the delay chain 1104 is disabled. Thus, the local input data signal is either propagated along the delay chain 1104 or along the bypass path. Each delay block 1102 receives a select signal SEL and its complement SELn that is used to control whether the bypass path or the delay chain 1304 is selected. The select signal SEL for a given delay block is provided to NAND1 The complement SELn for a given delay block is provided to NAND2. Each delay block 1102 receives a different select signal. The bypass paths can be selectively enabled or disabled through output of a pair of complementary m-bit selection signals SEL<m:1>, SELn<m:1>. The number of bits m is equal to the number of delay blocks 1102.

When an ith delay block 1102(i), and/or its ith delay chain 1104(i) is to be involved in the delay of the input signal IN, the ith selection signal SEL<i> is at a high or logic 1 level, and the ith complementary selection signal SELn<i> is at a low or logic 0 level, which in turn disables the bypass path. In turn, the third NAND gate NAND3 generates the local output signal of the ith delay block 1102(i) in response to the output of the ith delay chain 1104(i). Alternatively, when an ith delay block 1102(i), and/or its ith delay chain 1104(i) is to be uninvolved or not participate in the delay of the input signal IN, the ith selection signal SEL<i> is at the low or logic 0 level and the ith complementary selection signal SELn<i> at the high or logic 1 level, which in turn enables the bypass path. In turn, the third NAND gate NAND3 generates the local output signal of the ith delay block 1102(i) in response to the signal communicated on the bypass path.

Figure 11B:
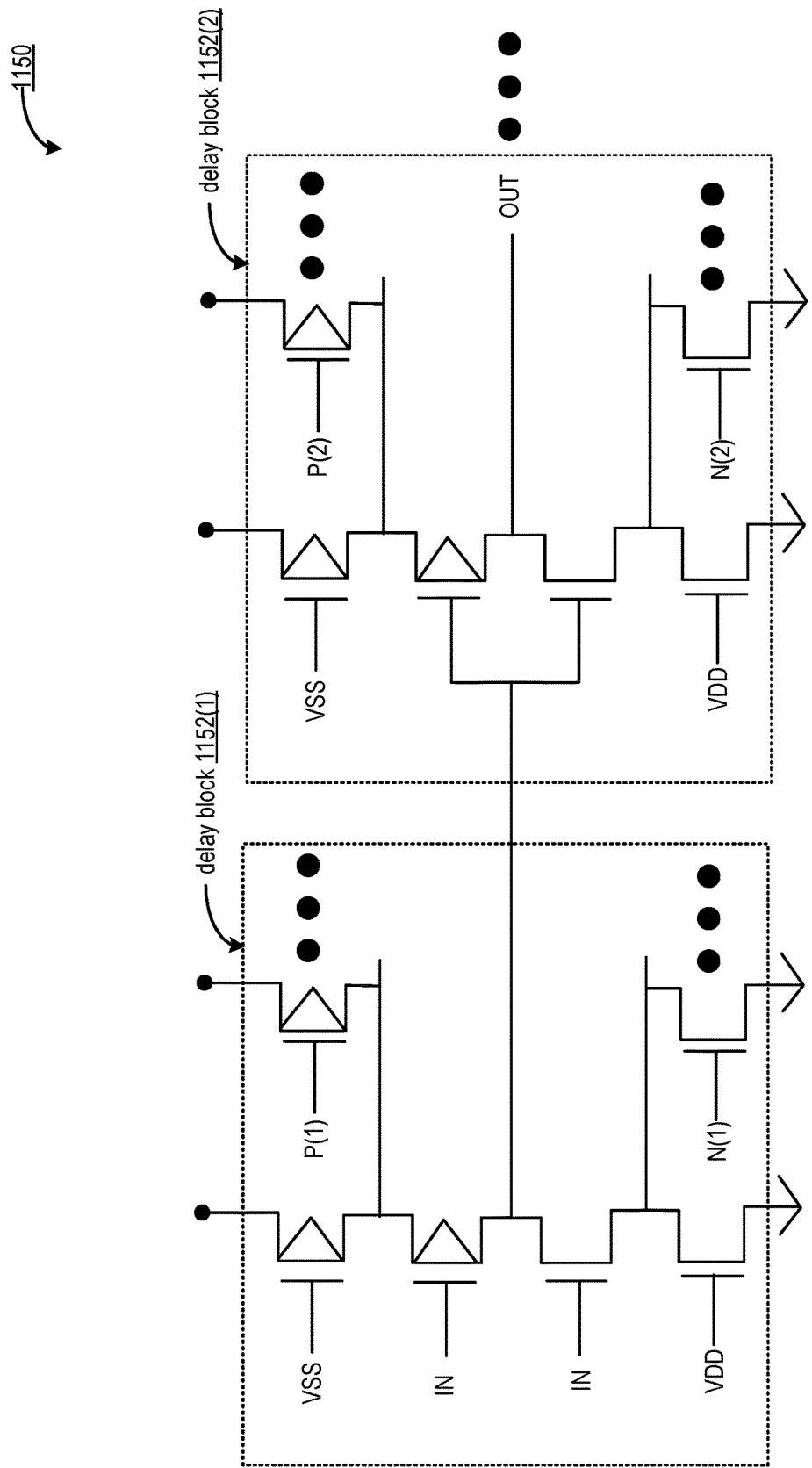
FIG. 11B is a block diagram of one embodiment of a fine delay circuit.

FIG. 11B shows one embodiment of a fine delay circuit 1150. The fine delay circuit 1150 may be used, for example, as the configuration for the fine delay circuits 1054 of FIG. 10B. As shown in FIG. 11B, the fine delay circuit 1150 may be configured to receive an input signal IN, and delay the input signal IN to generate an output signal OUT, which is a delayed version of the input signal IN.

The fine delay circuit includes a number of delay blocks 1152. In one embodiment, a delay block can be referred to as an inverter. The example configuration shown in FIG. 11B includes two delay block 1152(1) to 1152(2), although numbers other than two may be used. The first delay block 1152(1) is configured to receive the input signal IN. The first delay block 1152(1) includes a delay leg P(1), N(1), although multiple delay legs may be used. The second delay block 1152(2) is configured to receive, as an input, the output signal from the first delay block 1152(1). The second delay block 1152(2) includes a delay leg P(2), N(2), although multiple delay legs may be used. For each delay block, the delay legs of the delay block can be controlled by a selection signal. In one embodiment, a delay leg includes PMOS transistors (e.g., P(1), P(2) and NMOS transistors (e.g., N(1), N(2)). A drive strength of the delay block, corresponding with an amount of delay applied by the delay block, can be increased or decreased by activating greater or fewer delay legs in the delay block using the selection signal. For a load driven by the delay block, a small propagation delay is added to a clock signal for each activated delay leg. In general, a first delay leg of a delay block is weaker and provides less delay than subsequent delay legs in the delay block. In some cases, a weak delay leg can remain activated to maintain power to the delay block. Accordingly, multiple delay blocks can be utilized to tune the fine delay applied by the delay blocks. Each delay block following the first delay block has their respective input coupled to the output of a prior delay block, forming a chain.

An input signal that each of the delay blocks 1152 receives is referred to as its local input signal. Except for the first delay block 1152(1), each of the blocks 1152 receives its local input signal from a prior delay block 1152 of the fine delay circuit 1150. Additionally, an output signal that each of the delay blocks 1152 outputs is referred to as its local output signal. Except for the last, or in this example the second delay block 1152(1), each of the delay blocks 1152 may be configured to output a local output signal to a next delay block 1152 of the fine delay circuit 1150. Accordingly, the first delay block 1152(1) outputs a local output signal to the second delay block 1152(2), which the second delay block 1152(2) receives as its local input signal, and so on.

Each delay block 1152 in the chain may provide a unit of delay, which may be measured in units of time, such as a number of nanoseconds or picoseconds, for example. Each delay block 1152 in the chain provides a unit of delay in accordance with a number of delay legs activated in the delay block 1152. Accordingly, the total amount of delay by which the fine delay circuit 1150 delays its input signal IN corresponds with a total number of delay blocks in the fine delay circuit 1150 and the number of delay legs activated in each delay block.

Figure 12A:
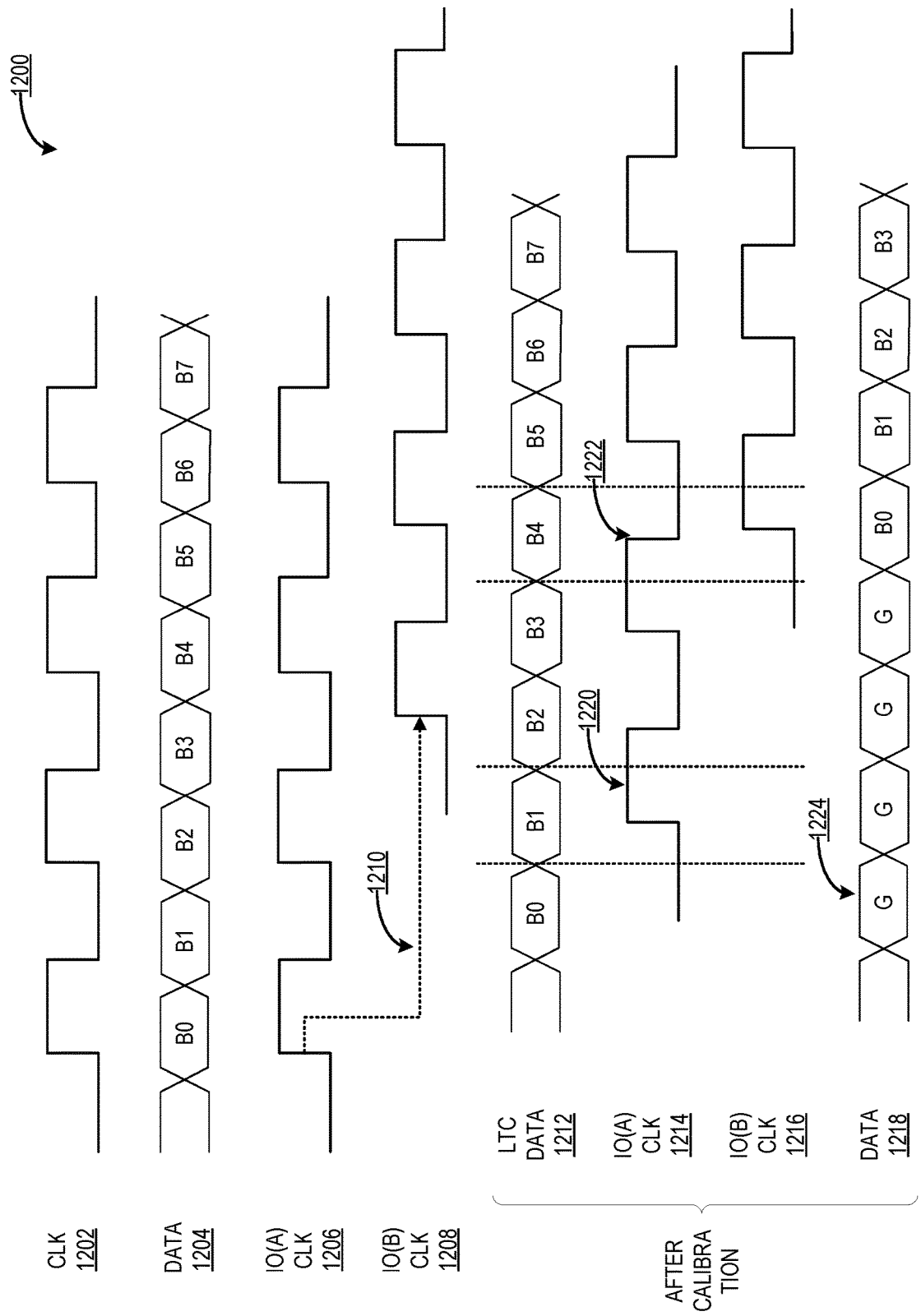
FIGS. 12A-12B are timing diagrams associated with various embodiments of an unmatched data input system.

FIG. 12A shows an example timing diagram 1200 associated with various embodiments of an unmatched data input system. The example timing diagram 1200 may show, for example, a calibration of an unmatched data input system, such as the unmatched data input system 1000 of FIG. 10A. In this example, a clock signal CLK 1202 is provided to the unmatched data input system. In addition, a data signal DATA 1204 is provided to the unmatched data input system. The data signal DATA 1204 includes a sequence of data pulses organized into, for example, bytes of data. For example, the data signal DATA 1204 can include a first byte of data B0, a second byte of data B1, a third byte of data B2, and so on.

As shown in FIG. 12A, the clock signal CLK 1202 arrives at different IOs of the unmatched data input system with different timings. A first IO(A) can receive the clock signal CLK 1202 at a first timing IO(A) CLK 1206. A second IO(B) can receive the clock signal CLK 1202 at a second timing IO(B) CLK 1208. In this example, the first IO(A) can be located closer to the clock in the unmatched data input system than the second IO(B). As the first IO(A) is located closer to the clock than the second IO(B), the first IO(A) can receive the clock signal CLK 1202 sooner, or with less delay, than the second IO(B). Because the first IO(A) receives the clock signal CLK 1202 sooner than the second IO(B), there is a difference between the clock signals received by the first IO(A) and the second IO(B). The clock signal received by the first IO(A) is shown as IO(A) CLK 1206, and the clock signal received by second IO(B) is show as IO(B) CLK 1208. The difference in timing between the clock signals received by the first IO(A) and the second IO(B) can be illustrated by a delta 1210, which shows the difference in timing between the first rising clock edges of IO(A) CLK 1206 and IO(B) CLK 1208.

Based on the clock signals received by the first IO(A) and the clock signal received by the second IO(B), the data signal DATA 1204 would be processed disparately. For example, when the first IO(A) receives the first rising clock edge of the clock signal CLK IO(A) 1206, the first IO(A) processes the first byte B0 of the data signal DATA 1204. When the second IO(B) receives the first rising clock edge of the clock signal CLK IO(B) 1208, the second IO(B) processes the fourth byte B3 of the data signal DATA 1204. Additionally, the clock signal CLK IO(A) 1206 and the clock signal CLK IO(B) CLK are not aligned in that the second falling clock edge of the clock signal CLK IO(A) occurs near the beginning of the data window for the fourth byte B3 of the data signal DATA 1204 and the first rising clock edge of the clock signal CLK IO(B) occurs near the end of the data window for the fourth byte B3 of the data signal DATA 1204. This discrepancy between the processing of the data signal DATA 1204 by the first IO(A) and the second IO(B) can lead to errors in the processing of the data signal DATA 1204. Thus, by calibrating the clock signal received by the first IO(A) and the clock signal received by the second IO(B), these errors can be avoided.

The example timing diagram 1200 shows an example of a calibrated clock signal IO(A) CLK 1214 and a calibrated clock signal IO(B) CLK 1216, which can be based on a calibration of the clock signal IO(A) CLK 1206 and the clock signal IO(B) CLK 1208. The calibration of the clock signal IO(A) CLK 1206 and the clock signal IO(B) CLK 1208 to generate the calibrated clock signal IO(A) CLK 1214 and the calibrated clock signal IO(B) CLK 1216 may involve the use of, for example, the multi-delay circuit 1050 of FIG. 10B. In this example, the calibration of the clock signals can be based on the data signal DATA 1204 which is stored as latch data LTC DATA 1212. From the latch data LTC DATA 1212, the clock signal IO(A) CLK 1206 and the clock signal IO(B) CLK 1208 can be calibrated such that the clock edges occur near the middle of the data windows of the latch data LTC DATA 1212. For example, as shown by the calibrated clock signal IO(A) 1214, the first rising clock edge can be calibrated to occur in the middle of the data window 1220 for the second byte B1 of the latch data LTC DATA 1212. Furthermore, as shown by the calibrated clock signal IO(B) 1216, the first rising clock edge can be calibrated to occur in the middle of the data window 1222 for the fifth byte B4 of the latch data LTC DATA 1212. Additionally, from the latch data LTC DATA 1212, it can be determined that the earliest instance where both the calibrated clock signal IO(A) 1214 and the calibrated clock signal IO(B) 1216 have a concurring clock edge is in the data window 1222 for the fifth byte B4 of the latch data LTC DATA 1212. Accordingly, the data signal DATA 1204 provided to the unmatched data input system can be calibrated such that the first byte B0 of data corresponds with the earliest instance where both the calibrated clock signal IO(A) 1214 and the calibrated clock signal IO(B) 1216 have a concurring clock edge. As shown in FIG. 12A, the calibrated data signal DATA 1218 includes filler data G 1224 until the earliest instance where both the calibrated clock signal IO(A) 1214 and the calibrated clock signal IO(B) 1216 have a concurring clock edge. The first byte B0 of the calibrated data signal DATA 1218 occurs at this earliest instance. As shown by this example, by calibrating the clock signals to IO(A) and IO(B) (and other IOs in the unmatched data input system), IO(A) and IO(B) (and the other IOs) can process the same byte of the data signal in parallel. This avoids errors associated with processing different bytes of a data signal with different timings.

Figure 12B:
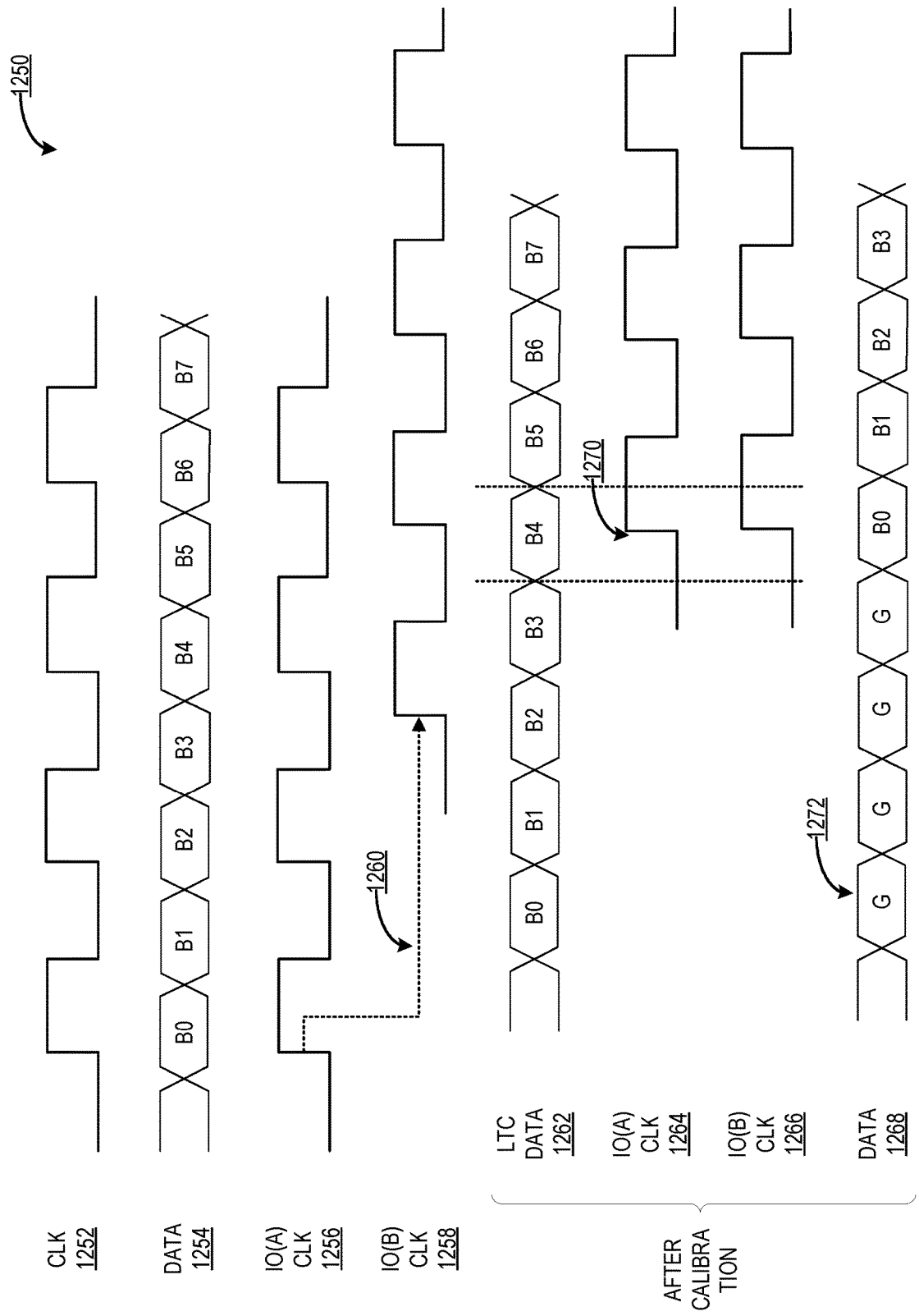

FIG. 12B shows an example timing diagram 1250 associated with various embodiments of an unmatched data input system. The example timing diagram 1250 may show, for example, a calibration of an unmatched data input system, such as the unmatched data input system 1000 of FIG. 10A. In this example, a clock signal 1252 is provided to the unmatched data input system. The data signal DATA 1254 includes a sequence of data pulses organized into, for example, bytes of data. For example, the data signal DATA 1254 can include a first byte of data B0, a second byte of data B1, a third byte of data B2, and so on.

As shown in FIG. 12B, the clock signal CLK 1252 arrives at different IOs of the unmatched data input system with different timings. A first IO(A) can receive the clock signal CLK 1252 at a first timing IO(A) CLK 1256. A second IO(B)

can receive the clock signal CLK 1252 at a second timing IO(B) CLK 1258. In this example, the first IO(A) can be located closer to the clock in the unmatched data input system than the second IO(B). As the first IO(A) is located closer to the clock than the second IO(B), the first IO(A) can receive the clock signal CLK 1252 sooner, or with less delay, than the second IO(B). Because the first IO(A) receives the clock signal CLK 1252 sooner than the second IO(B), there is a difference between the clock signals received by the first IO(A) and the second IO(B). The clock signal received by the first IO(A) is shown as IO(A) CLK 1206, and the clock signal received by second IO(B) is show as IO(B) CLK 1258. The difference in timing between the clock signals received by the first IO(A) and the second IO(B) can be illustrated by a delta 1260, which shows the difference in timing between the first rising clock edges of IO(A) CLK 1256 and IO(B) CLK 1258.

As illustrated in FIG. 12A and here in FIG. 12B, based on the clock signals received by the first IO(A) and the clock signal received by the second IO(B), the data signal DATA 1254 would be processed disparately. For example, when the first IO(A) receives the first rising clock edge of the clock signal CLK IO(A) 1256, the first IO(A) processes the first byte B0 of the data signal DATA 1254. When the second IO(B) receives the first rising clock edge of the clock signal CLK IO(B) 1258, the second IO(B) processes the fourth byte B3 of the data signal DATA 1254. Additionally, the clock signal CLK IO(A) 1256 and the clock signal CLK IO(B) CLK are not aligned in that the second falling clock edge of the clock signal CLK IO(A) occurs near the beginning of the data window for the fourth byte B3 of the data signal DATA 1254 and the first rising clock edge of the clock signal CLK IO(B) occurs near the end of the data window for the fourth byte B3 of the data signal DATA 1254. This discrepancy between the processing of the data signal DATA 1254 by the first IO(A) and the second IO(B) can lead to errors in the processing of the data signal DATA 1254. Thus, by calibrating the clock signal received by the first IO(A) and the clock signal received by the second IO(B), these errors can be avoided.

The example timing diagram 1250 shows an example of a calibrated clock signal IO(A) CLK 1264 and a calibrated clock signal CLK 1266, which can be based on a calibration of the clock signal IO(A) CLK 1256 and the clock signal IO(B) CLK 1258. The calibration of the clock signal IO(A) CLK 1256 and the clock signal IO(B) CLK 1258 to generate the calibrated clock signal IO(A) CLK 1264 and the calibrated clock signal IO(B) CLK 1266 may involve the use of, for example, the multi-delay circuit 1050 of FIG. 10B. In this example, the clock signals are calibrated to match the clock signal with the most delay from the clock signal, which in this example may be the clock signal IO(B) CLK 1258. From the latch data LTC DATA 1262, the clock signal IO(B) CLK 1258 can be calibrated such that the clock edges occur near the middle of the data window for the fifth byte B4 of the latch data LTC DATA 1212, which is the data window immediately following the first clock edge of the clock signal IO(B) CLK 1258. For example, as shown by the calibrated clock signal IO(B) 1266, the first rising clock edge can be calibrated to occur in the middle of the data window 1270 for the fifth byte B4 of the latch data LTC DATA 1262. Furthermore, as shown by the calibrated clock signal IO(A) 1264, the clock signals for the other IOs can be calibrated to match the calibrated clock signal IO(B) 1266. Additionally, from the latch data LTC DATA 1262, it can be determined that the earliest instance where the calibrated clock signal IO(B) 1266 has a clock edge is in the data window 1270 for the fifth byte B4 of the latch data LTC DATA 1262. Accordingly, the data signal DATA 1254 provided to the unmatched data input system can be calibrated such that the first byte B0 of data corresponds with the earliest instance where the calibrated clock signal IO(B) 1266 has a clock edge. As shown in FIG. 12B, the calibrated data signal DATA 1268 includes filler data G 1272 until the earliest instance where the calibrated clock signal IO(B) 1216 has a clock edge. The first byte B0 of the calibrated data signal DATA 1272 occurs at this earliest instance. As shown by this example, by calibrating the clock signals to IO(A) and IO(B) (and other IOs in the unmatched data input system), IO(A) and IO(B) (and the other IOs) can process the same byte of the data signal in parallel. This avoids errors associated with processing different bytes of a data signal with different timings.

Figure 13:
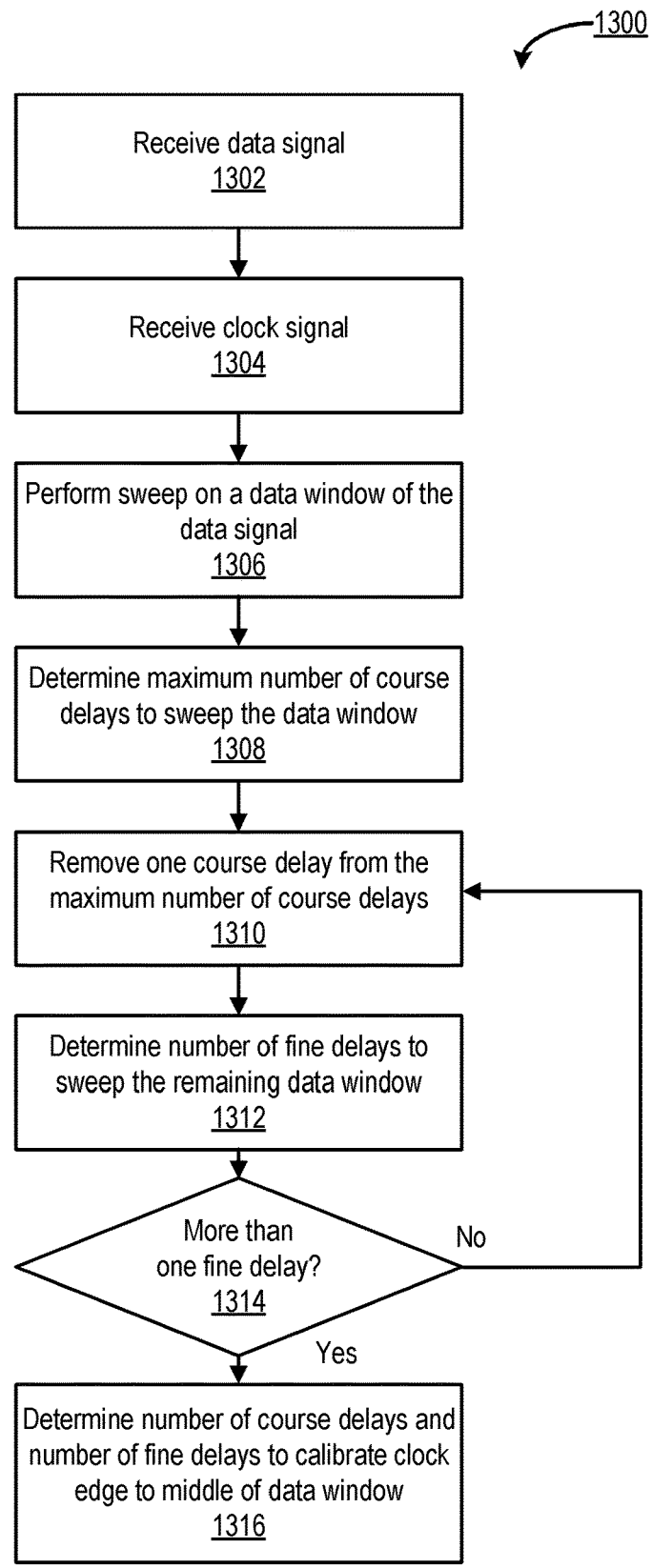
FIG. 13 is a flowchart of one embodiment of a process for calibrating a clock signal in an unmatched data input system.

FIG. 13 shows a flowchart of one embodiment of a process 1300 for calibrating a clock signal in an unmatched data input system. In one embodiment, process 1300 can be used to calibrate delay of a clock signal in the unmatched data input system 1000 of FIG. 10A. It should be understood that there can be additional, fewer, or alternative steps performed in similar or alternative orders, or in parallel, based on the various features and embodiments discussed herein unless otherwise stated.

As shown in FIG. 13, steps 1302 and 1304 describe receiving an input, for example, by an unmatched data input system. Step 1302 involves receiving a data signal. The data signal can be, for example, a sequence of data pulses organized into, for example, bytes of data. Step 1304 involves receiving a clock signal. The clock signal can include, for example, repetitive cycles of high level portions and low level portions, creating clock pulses.

As shown in FIG. 13, steps 1306 to 1316 describe calibrating the clock signal, for example, so that the IOs of an unmatched data input system can process the same byte of the data signal in parallel. Step 1306 involves performing a sweep on a data window of the data signal 1306. Performing a sweep on the data window can involve scanning for determining the data pulses associated with, for example, one byte of data in the data signal. Step 1308 involves determining a maximum number of coarse delays to sweep the data window. Determining the maximum number of coarse delays to sweep a data window can involve, for example, using coarse delay circuits to implement a delay that exceeds the data window. In other words, the maximum number of coarse delays to sweep a data window is a minimum number of coarse delays to implement a delay that is longer than the data window. Step 1310 involves removing one coarse delay from the maximum number of coarse delays. By removing one coarse delay from the maximum number of coarse delays, a number of coarse delays that can fit within a data window can be determined. Step 1312 involves determining a number of fine delays to sweep the remaining data window. As removing one coarse delay from the maximum number of coarse delays may leave a portion of the data window that is not covered by the delay from the coarse delays, fine delays can be implemented until the delay from the coarse delays and the fine delays cover the data window. Step 1314 involves determining whether more than one fine delay was used to sweep the remaining data window. In cases where only one fine delay or no fine delays were used to sweep the remaining data window, the process 1300 can return to step 1310 and remove one more coarse delay from the number of coarse delays. Allowing an opportunity to use more fine delays to sweep the data window may improve accuracy in calibrating the clock signal. In cases where more than one fine delay was used to sweep the remaining data window, the process 1300 can determine a number of coarse delays and a number of fine delays to calibrate a clock edge of the clock signal to the middle of a data window of the data signal. For example, the number of coarse delays can be half of a total number of coarse delays used to sweep the data window, and the number of fine delays can be half of a total number of fine delays used to sweep the data window.

Figure 14A:
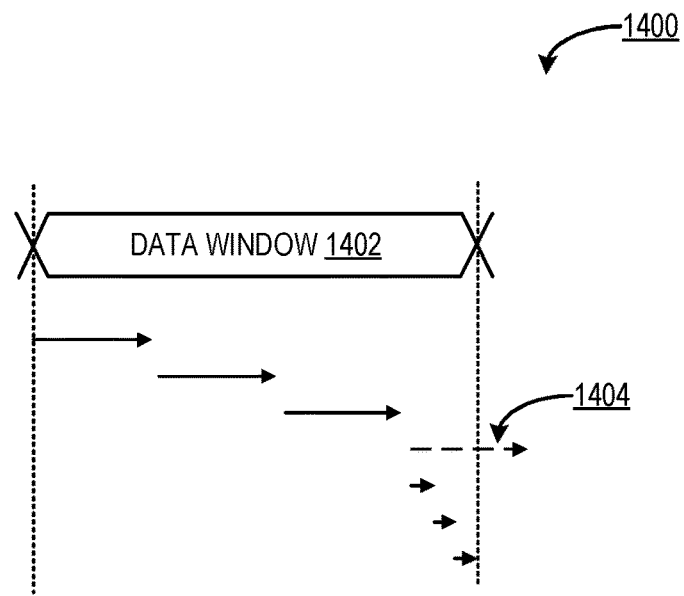
FIGS. 14A-14C are scenarios associated with calibrating a clock signal in an unmatched data input system.

FIG. 14A shows an example scenario 1400 associated with calibrating a clock signal in an unmatched data input system. As shown in FIG. 14A, a data window 1402 can be swept to calibrate a clock signal in an unmatched data input system, such as the unmatched data input system 1000 of FIG. 10A. Sweeping the clock signal, in this example, can involve determining a number of coarse delays and a number of fine delays to sweep the data window 1402. In the example scenario 1400, four coarse delays exceed the data window 1402. Accordingly, the fourth coarse delay 1404 is removed. Three fine delays sweep the remaining portion of the data window 1402. Thus, calibrating the clock signal in the unmatched data input system can be based on a total number of three coarse delays and three fine delays used to sweep the data window 1402. It should be understood that other numbers of coarse delays and fine delays are possible.

Figure 14B:
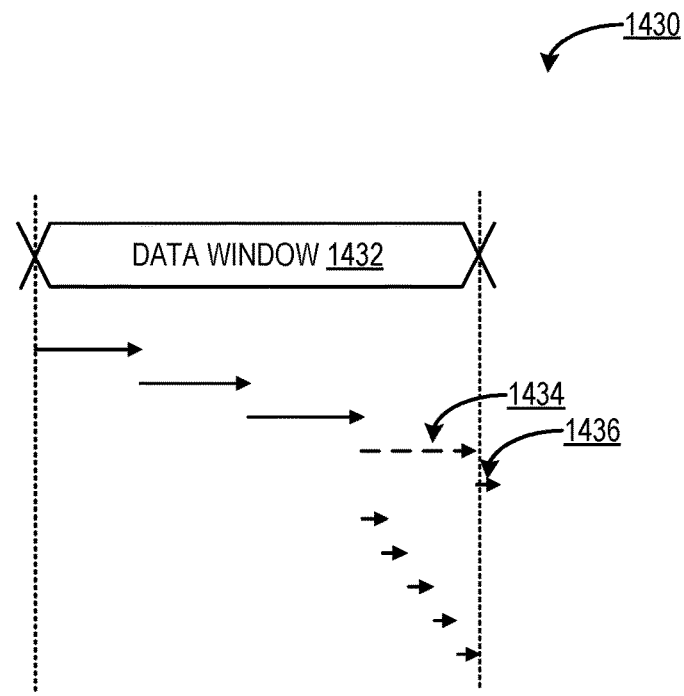

FIG. 14B shows an example scenario 1430 associated with calibrating a clock signal in an unmatched data input system. As shown in FIG. 14B, a data window 1432 can be swept to calibrate a clock signal in an unmatched data input system, such as the unmatched data input system 1000 of FIG. 10A. Sweeping the clock signal, in this example, can involve determining a number of coarse delays and a number of fine delays to sweep the data window. In the example scenario 1430, four coarse delays fit within the data window 1432. With four coarse delays, only one fine delay 1436 fits (or exceeds) the data window 1432. Accordingly, the fourth coarse delay 1434 and the one fine delay 1436 are removed. Five fine delays sweep the remaining portion of the data window 1432. Thus, calibrating the clock signal in the unmatched data input system can be based on a total number of three coarse delays and five fine delays used to sweep the data window 1432. It should be understood that other numbers of coarse delays and fine delays are possible.

Figure 14C:
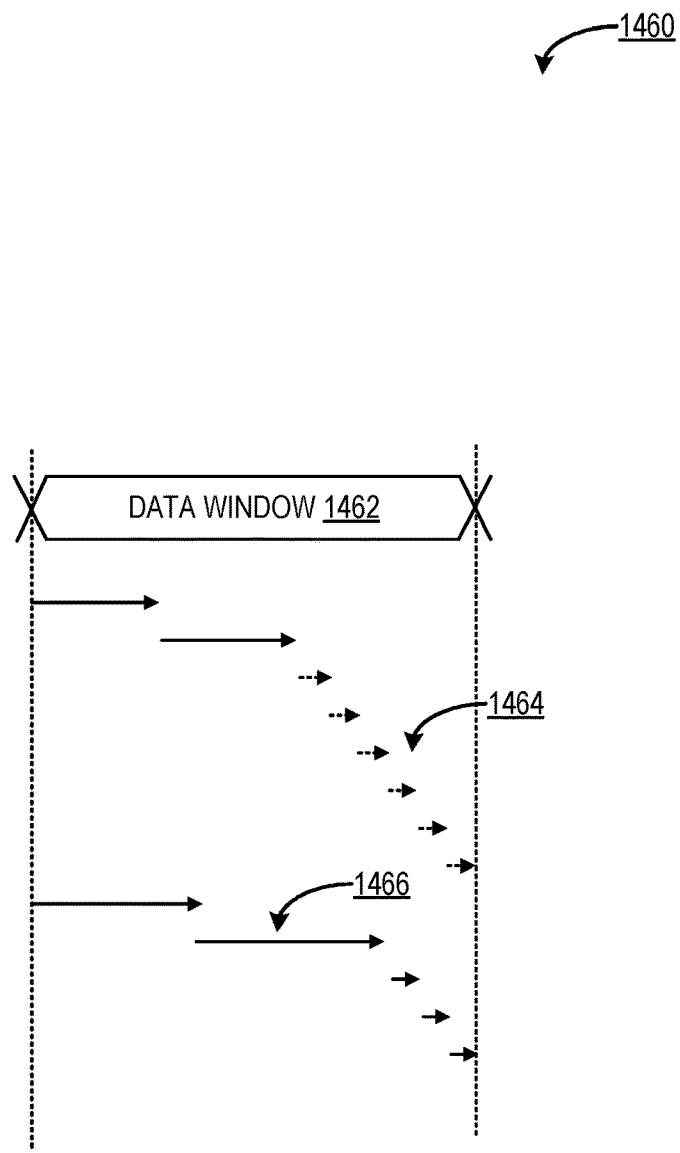

FIG. 14C shows an example scenario 1460 associated with calibrating a clock signal in an unmatched data input system. As shown in FIG. 14C, a data window 1462 can be swept to calibrate a clock signal in an unmatched data input system, such as the unmatched data input system 1000 of FIG. 10A. Sweeping the clock signal, in this example, can involve determining a number of coarse delays and a number of fine delays to sweep the data window 1462. In the example scenario 1460, two coarse delays fit within the data window 1462 (and three coarse delays would exceed the data window 1462). Six fine delays 1464 are necessary to sweep the remaining portion of the data window 1462. In this example, the coarse delays can be adjusted to provide a broader delay to reduce the number of fine delays necessary to sweep the remaining portion of the data window 1462. Accordingly, the six fine delays 1464 are removed. Two longer coarse delays 1466 fit within the data window 1462. Three fine delays sweep the remaining portion of the data window 1462. Thus, calibrating the clock signal in the unmatched data input system can be based on a total number of two longer coarse delays and three fine delays used to sweep the data window 1462. It should be understood that other numbers of coarse delays and fine delays are possible.

The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

It is intended that the foregoing be understood as an illustration of selected forms that the invention can take and not as a definition of the invention. Finally, it should be noted that any aspect of any of the preferred embodiments described herein can be used alone or in combination with one another.

What is claimed is:

1. A method comprising:
    receiving, by a system, a data signal;
    storing, by the system, the data signal as a latched data signal;
    receiving, by the system, a clock signal;
    based on the received clock signal, providing a set of local clock signals to a set of input/outputs (IO);

calibrating, by the system, the local clock signals for each IO of the set of IOs based on the latched data signal, wherein the calibrating comprises:
- determining, for each IO of the set of IOs, a delay to apply to a respective local clock signal of local clock signals based on the latched data signal to align clock edges of the set of local clock signals; and
- delaying the local clock signal for each IO of the set of IOs;

calibrating, by the system, the latched data signal based on the calibrated local clock signals; and processing, by the system, the calibrated data signal based on the calibrated local clock signals.

2. The method of claim 1, wherein the determining the delay comprises:
- determining a total number of first delays associated with a first delay time based on a data window of the latched data signal;
- determining a total number of second delays associated with a second delay time based on the data window of the latched data signal and the total number of first delays, wherein the first delay time is longer than the second delay time.

3. The method of claim 2, wherein the determining the total number of first delays comprises:
- determining a minimum number of first delays associated with the first delay time that exceeds the data window of the latched data signal, wherein the number of first delays is one less than the minimum number of first delays.

4. The method of claim 2, wherein the determining the delay further comprises:
- determining a number of first delays associated with the first delay time to align the clock edges of the respective local clock signal with a middle of the data window based on the total number of first delays; and
- determining a number of second delays associated with the second delay time to align the clock edges of the respective local clock signal with the middle of the data window based on the total number of second delays.

5. The method of claim 1, wherein the calibrating the local clock signals further comprises:
- determining, for each IO of the set of IOs, a clock edge of the respective local clock signal at which to process the data signal.

6. The method of claim 1, wherein the calibrating the local clock signals is based on the IO of the set of IOs that is last to receive the respective local clock signal.

7. The method of claim 1, wherein the calibrating the local clock signals is based on a set of multi-delay circuits that each include a first delay circuit that delays the respective local clock signal by a first delay time and a second delay circuit that delays the respective local clock signal by a second delay time, wherein the second delay time is shorter than the first delay time.

8. The method of claim 1, wherein each IO of the set of IOs is associated with a different timing of the respective local clock signal and the respective local clock signal is calibrated for each IO of the set of IOs in parallel.

9. An apparatus, comprising:
- an interface for receiving a data signal and receiving a clock signal;
- a set of input/outputs (IOs) connected to the interface along a set of clock paths, wherein the set of clock paths communicate a set of local clock signals to the set of IOs based on the received clock signal; and
- a controller in communication with the interface and the set of IOs, wherein the controller causes the apparatus to perform:
  - receiving a data signal on the interface;
  - storing the received data signal as a latched data signal;
  - receiving a clock signal on the interface;
  - calibrating the local clock signals for each latch circuit of the set of latch circuits based on the latched data signal, wherein the calibrating comprises:
    - determining, for each IO of the set of IOs, a delay to apply to a respective local clock signal of the set of local clock signals based on the latched data signal to align clock edges of the set of local clock signals; and
    - delaying the local clock signal for each IO of the set of IOs;
  - calibrating the latched data signal based on the calibrated local clock signals; and
  - processing the calibrated data signal based on the calibrated local clock signals.

10. The apparatus of claim 9, wherein the determining the delay comprises:
- determining a total number of first delays associated with a first delay time based on a data window of the latched data signal;
- determining a total number of second delays associated with a second delay time based on the data window of the latched data signal and the total number of first delays, wherein the first delay time is longer than the second delay time.

11. The apparatus of claim 10, wherein the determining the total number of first delays comprises:
- determining a minimum number of first delays associated with the first delay time that exceeds the data window of the latched data signal, wherein the number of first delays is one less than the minimum number of first delays.

12. The apparatus of claim 10, wherein the determining the delay further comprises:
- determining a number of first delays associated with the first delay time to align the clock edges of the respective local clock signal with a middle of the data window based on the total number of first delays; and
- determining a number of second delays associated with the second delay time to align the clock edges of the respective local clock signal with the middle of the data window based on the total number of second delays.

13. The apparatus of claim 9, wherein the calibrating the local clock signals further comprises:
- determining for each IO of the set of IOs, a clock edge of the respective local clock signal at which to process the data signal.

14. The apparatus of claim 9, wherein the calibrating the local clock signals is based on the IO of the set of IOs that is last to receive the respective local clock signal.

15. The apparatus of claim 9, wherein the calibrating the local clock signals is based on a set of multi-delay circuits that each include a first delay circuit that delays the respective local clock signal by a first delay time and a second delay circuit that delays the respective local clock signal by a second delay time, wherein the second delay time is shorter than the first delay time.

16. A system comprising:
- a set of data signal input circuits configured to receive a data signal and store the received data signal as a latched data signal;

a clock signal input circuit configured to receive a clock signal;

a set of clock paths that connect the clock signal input circuit to the set of data signal input circuits;

a set of input/output (IO) circuits on the clock paths between the data signal input circuit and the clock signal input circuit, the set of IO circuits are configured to receive, via the set of clock paths, local clock signals at different timings based a clock signal received at the clock signal input circuit; and a set of multi-delay circuits that on the set of clock paths and connected between the set of data signal input circuits and the clock signal input circuit, each multi-delay circuit of the set of multi-delay circuits includes a first delay circuit that delays a respective local clock signal by a first delay time and a second delay circuit that delays the respective local clock signal by a second delay time, wherein the second delay time is shorter than the first delay time, wherein the set of multi-delay circuits are calibrated to apply the first and second delay time to the local clock signal for each IO circuit of the set of IO circuits based on the latched data signal to align clock edges of the set of local clock signals.

17. The system of claim 16, wherein the set of multi-delay circuits are calibrated based on a total number of first delays associated with the first delay time determined based on a data window of the latched data signal and a total number of second delays associated with the second delay time determined based on the data window of the latched data signal and the total number of first delays.

18. The system of claim 17, wherein the total number of first delays is based on a minimum number of first delays associated with the first delay time that exceeds the data window of the latched data signal, wherein the number of first delays is one less than the minimum number of first delays.

19. The system of claim 17, wherein the set of multi-delay circuits are calibrated further based on a number of first delays associated with the first delay time to align the clock edges of the local clock signals with a middle of the data window and a number of second delays associated with the second delay time to align the clock edges of the local clock signals with the middle of the data window.

20. The system of claim 17, wherein each IO circuit of the set of IO circuits is associated with a different timing of the local clock signals and the set of multi-delay circuits are calibrated for each IO circuit of the set of IO circuits in parallel.

\* \* \* \* \*